(12) United States Patent
Chang et al.

(10) Patent No.: US 9,318,461 B2
(45) Date of Patent: Apr. 19, 2016

(54) WAFER LEVEL ARRAY OF CHIPS AND METHOD THEREOF

(71) Applicant: XINTEC INC., Zhongli, Taoyuan County (TW)

(72) Inventors: Chun-Wei Chang, New Taipei (TW); Kuei-Wei Chen, Keelung (TW); Chia-Ming Cheng, New Taipei (TW); Chia-Sheng Lin, Zhongli (TW); Chien-Hui Chen, Zhongli (TW); Tsang-Yu Liu, Zhubei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/255,872

(22) Filed: Apr. 17, 2014

(65) Prior Publication Data

US 2014/0312482 A1    Oct. 23, 2014

Related U.S. Application Data

(60) Provisional application No. 61/813,853, filed on Apr. 19, 2013.

(51) Int. Cl.
*H01L 21/00*    (2006.01)
*H01L 23/538*    (2006.01)
(Continued)

(52) U.S. Cl.
CPC ............ *H01L 24/26* (2013.01); *H01L 21/6835* (2013.01); *H01L 21/76898* (2013.01); *H01L 21/784* (2013.01); *H01L 24/27* (2013.01); *H01L 24/94* (2013.01); *H01L 24/05* (2013.01); *H01L 24/11* (2013.01); *H01L 24/13* (2013.01); *H01L 2224/02372* (2013.01); *H01L 2224/03002* (2013.01); *H01L 2224/0401* (2013.01); *H01L 2224/04042* (2013.01); *H01L 2224/05009* (2013.01); *H01L 2224/05548* (2013.01); *H01L 2224/05562* (2013.01);
(Continued)

(58) Field of Classification Search
CPC ............ H01L 21/76898; H01L 21/784; H01L 21/6835; H01L 24/11; H01L 24/18; H01L 21/78; H01L 2224/02371; H01L 2224/04042; H01L 2224/05009
USPC ............... 438/620, 621, 781, 66, 67, 68, 107, 438/110, 406, 584, 618, 619, 758, 462; 257/458, 620, 621, E23.179, 618, 773, 257/776, E23.132, E21.502, 690, E23.524
See application file for complete search history.

(56) References Cited

U.S. PATENT DOCUMENTS

| | | | | |
|---|---|---|---|---|
| 2003/0170966 | A1* | 9/2003 | Lutz | B81C 1/00269 438/456 |
| 2007/0262381 | A1* | 11/2007 | Kojima | B81B 7/007 257/347 |
| 2008/0153265 | A1* | 6/2008 | Lyne | 438/465 |

*Primary Examiner* — Jasmine Clark
(74) *Attorney, Agent, or Firm* — Liu & Liu

(57) ABSTRACT

A wafer level array of chips is provided. The wafer level array of chips comprises a semiconductor wafer, and a least one extending-line protection. The semiconductor wafer has at least two chips, which are arranged adjacent to each other, and a carrier layer. Each chip has an upper surface and a lower surface, and comprises at least one device. The device is disposed upon the upper surface, covered by the carrier layer. The extending-line protection is disposed under the carrier layer and between those two chips. The thickness of the extending-line protection is less than that of the chip. Wherein the extending-line protection has at least one extending-line therein. In addition, a chip package fabricated by the wafer level array of chips, and a method thereof are also provided.

23 Claims, 23 Drawing Sheets

(51) Int. Cl.
　　　*H01L 23/00*　　　(2006.01)
　　　*H01L 21/768*　　(2006.01)
　　　*H01L 21/784*　　(2006.01)
　　　*H01L 21/683*　　(2006.01)
(52) U.S. Cl.
　　　CPC ............. *H01L 2224/05566* (2013.01); *H01L 2224/05567* (2013.01); *H01L 2224/05624* (2013.01); *H01L 2224/05647* (2013.01); *H01L 2224/05655* (2013.01); *H01L 2224/11002* (2013.01); *H01L 2224/131* (2013.01); *H01L 2224/13022* (2013.01); *H01L 2224/13024* (2013.01); *H01L 2224/13025* (2013.01); *H01L 2224/13111* (2013.01); *H01L 2224/94* (2013.01); *H01L 2924/14* (2013.01); *H01L 2924/15788* (2013.01)

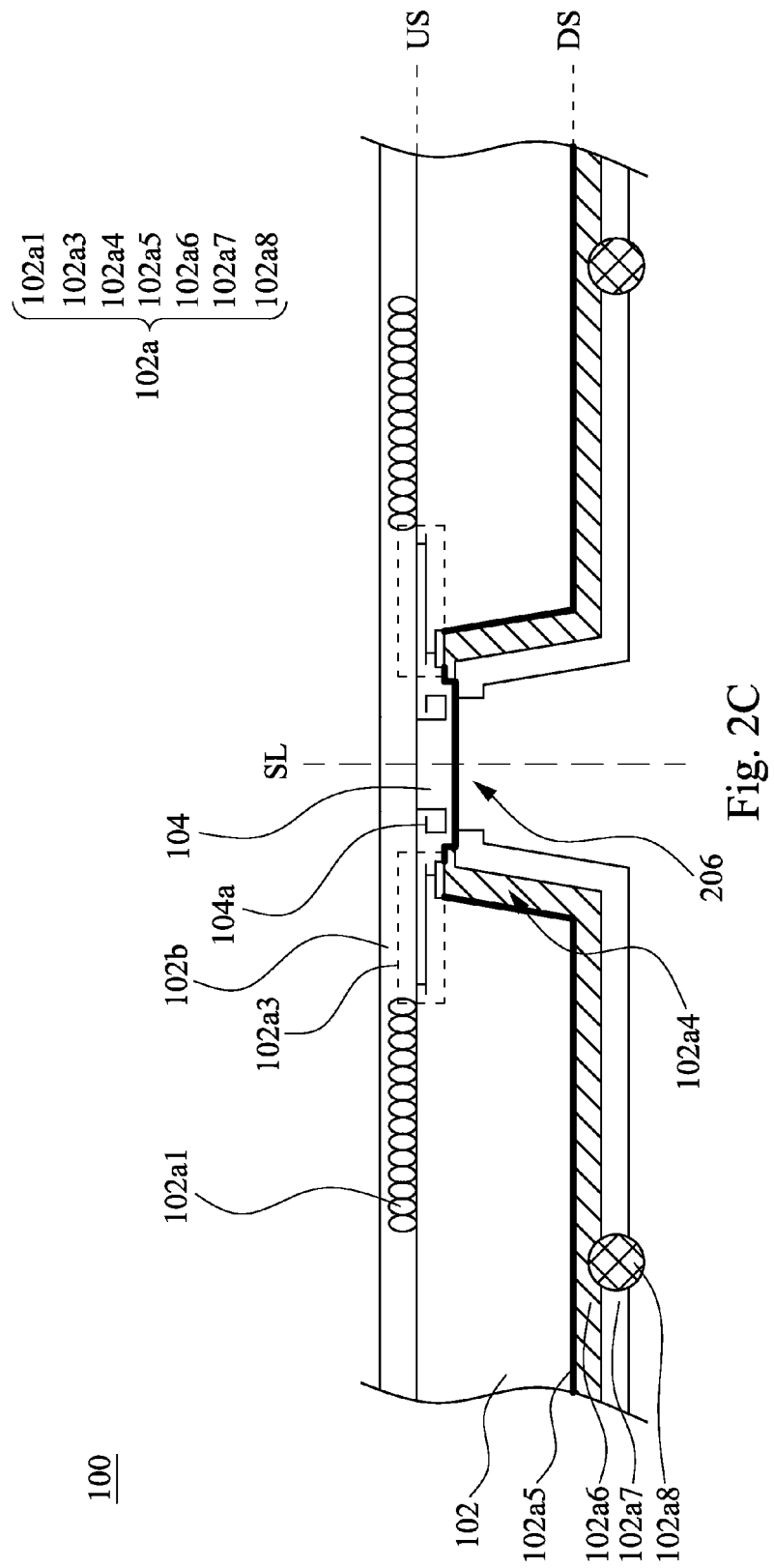

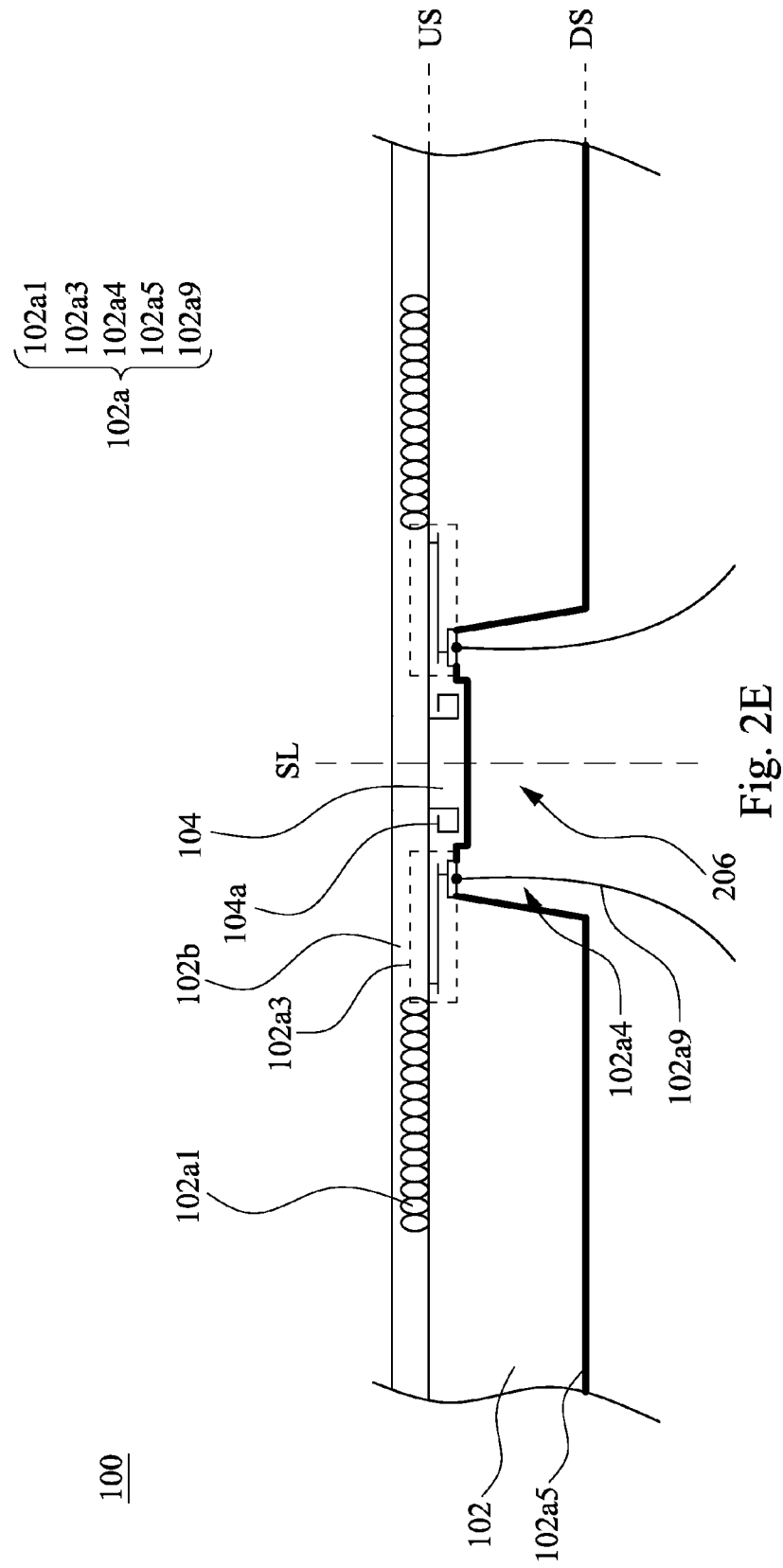

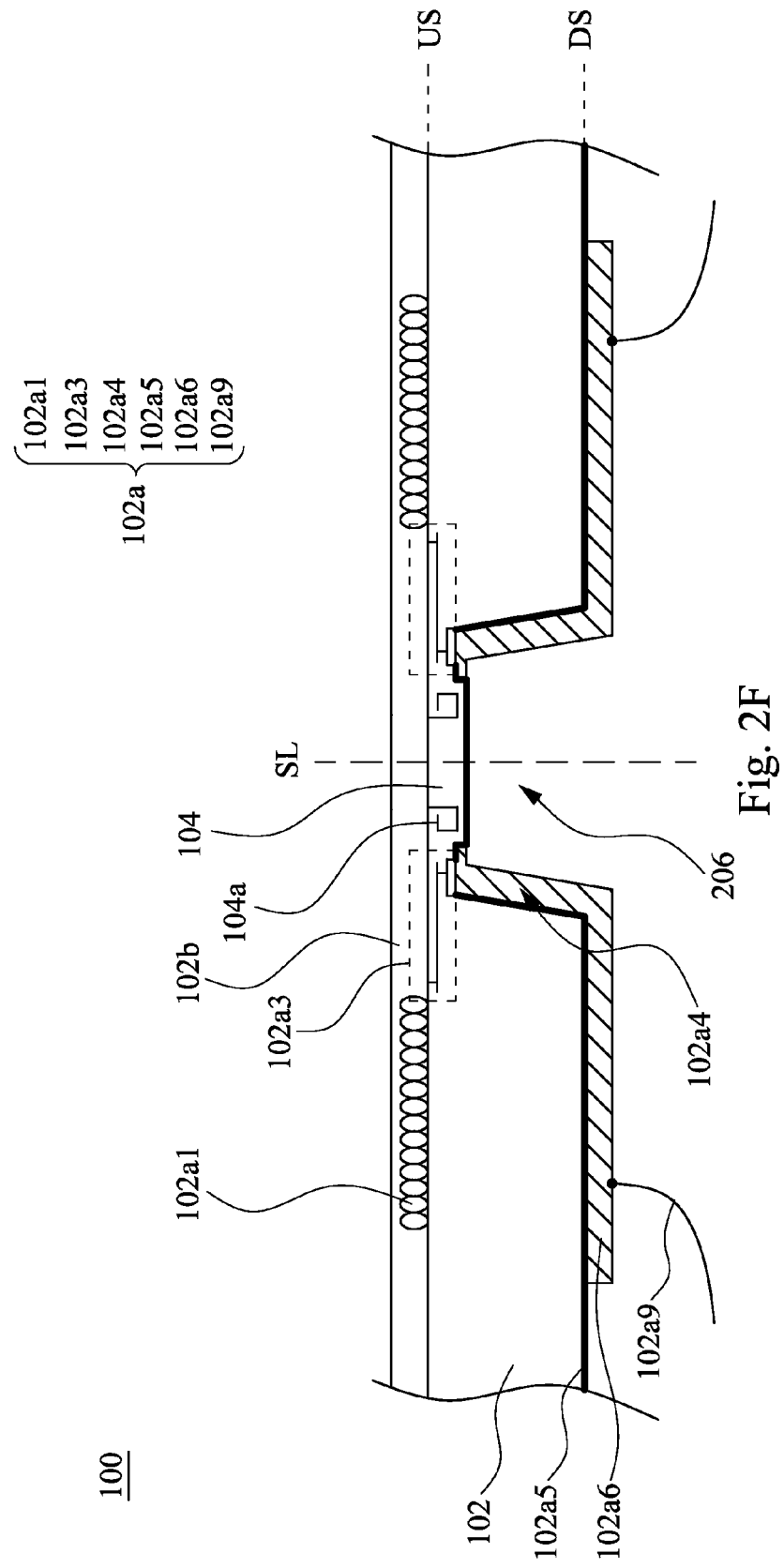

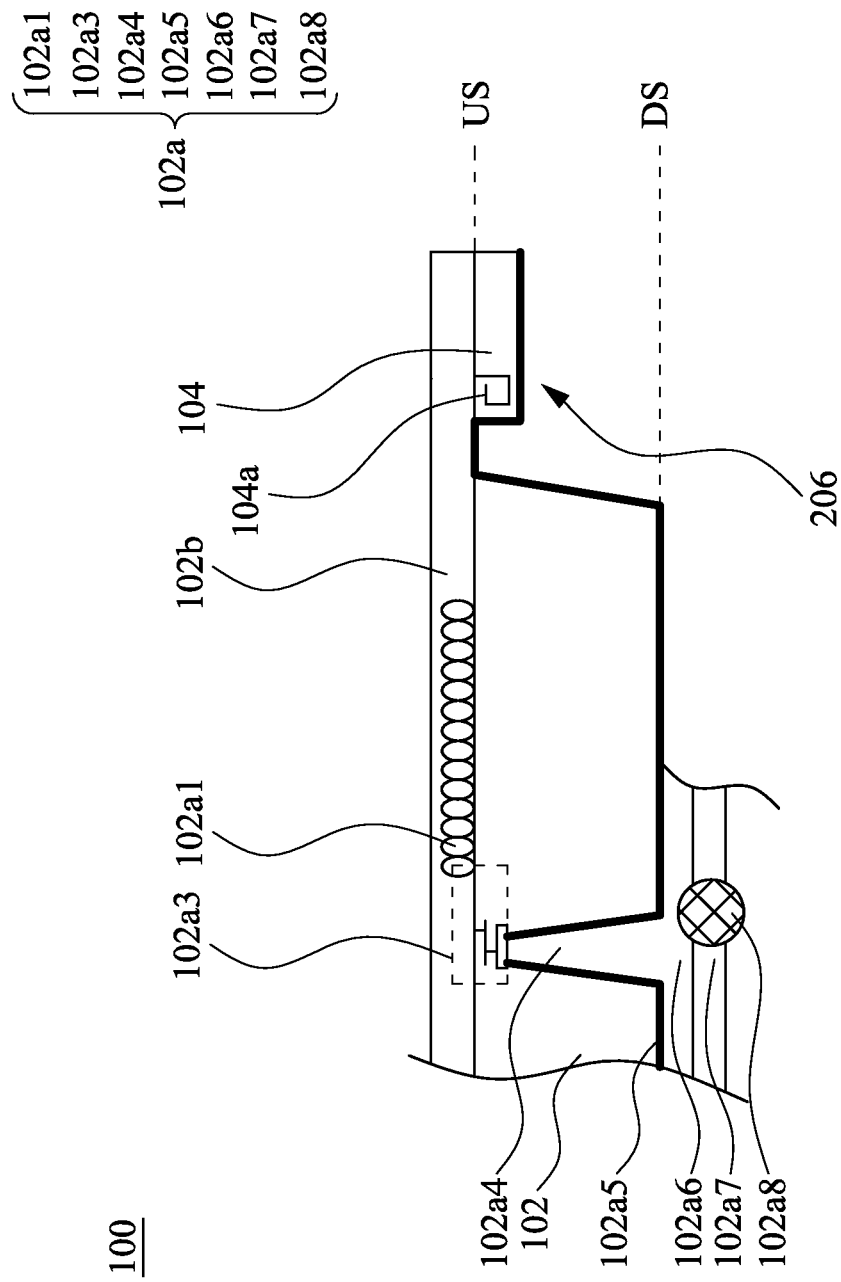

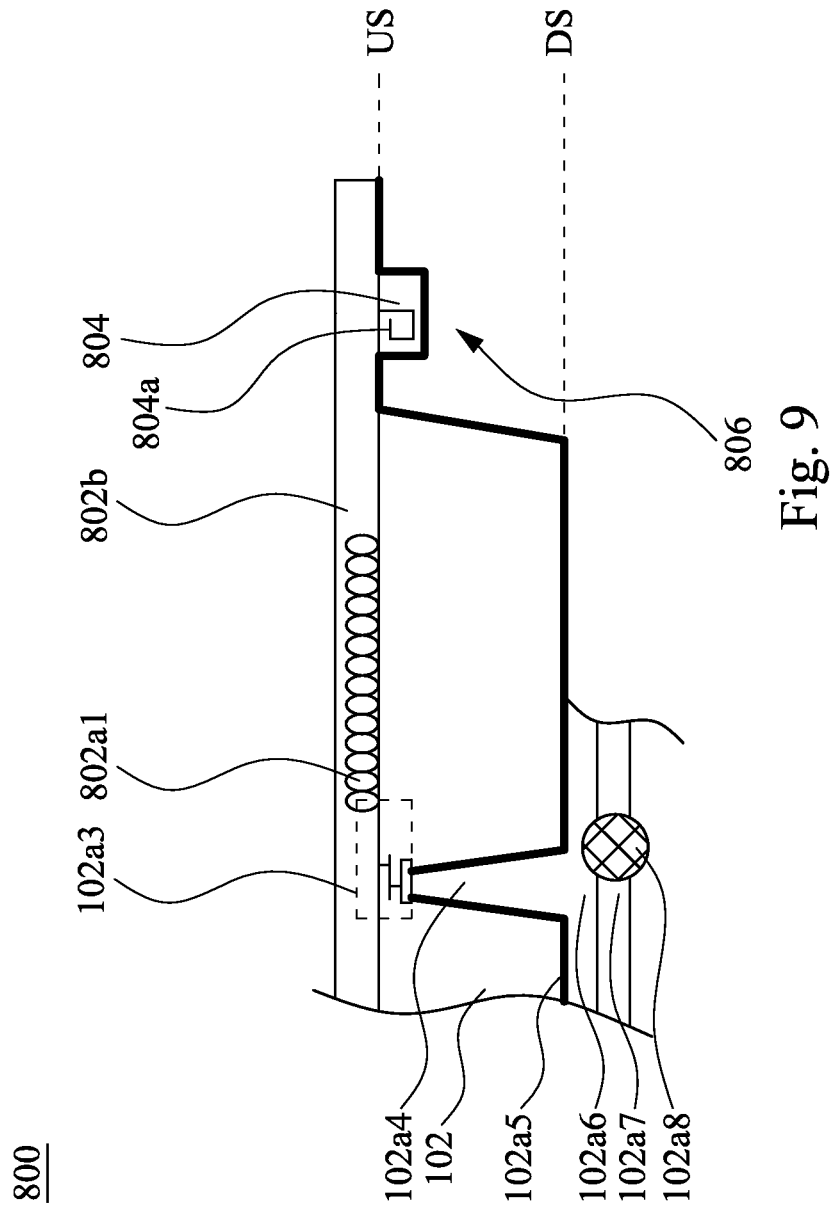

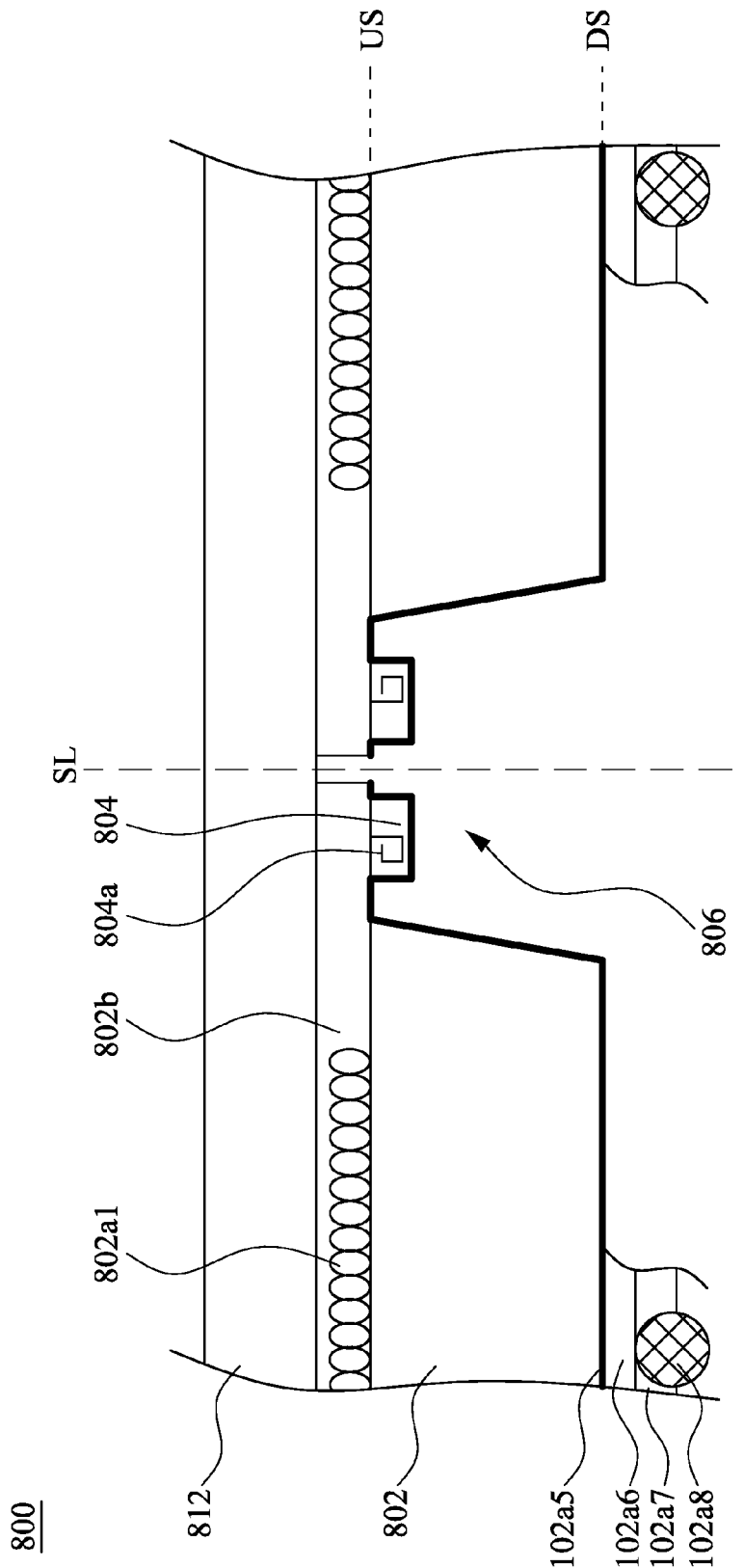

WAFER LEVEL ARRAY OF CHIPS AND METHOD THEREOF

RELATED APPLICATIONS

This application claims priority to U.S. provisional Application Ser. No. 61/813,853, filed Apr. 19, 2013, which is herein incorporated by reference.

BACKGROUND

1. Field of Invention

The present invention relates to a chip and a method for manufacturing thereof. More particularly, the present invention relates to a wafer level array of chips and method thereof.

2. Description of Related Art

Wafer level packaging (WLP) is one of the integrated circuit (IC) packaging techniques. In WLP, packaging and testing processes are performed after all chips are fabricated on one semiconductor wafer. When the packaging and testing processes are completed, a cutting process is performed to separate the chips, which are fabricated on the semiconductor wafer. FIG. 1A is a top-view of a semiconductor wafer with a chip array and scribe lines. FIG. 1B is a portion of FIG. 1A. FIG. 1C is a cross-sectional view of AA' line in FIG. 1B. As shown in FIG. 1A, chip packages 100 are fabricated on a semiconductor wafer 10, and then the chip packages 100 are separate by the cutting process cutting along the scriber lines SL disposed between the chip packages 100. As illustrated in FIG. 1B and FIG. 1C, an inter-chip trench 106 is disposed between two adjacent chip packages 100 on the semiconductor wafer 10. The inter-chip trench 106 is formed for a cutter to enter and separate those two adjacent chip packages 100. However, as integrated density of IC keeping increasing, available space for IC within the chip should be accordingly increased to avoid issues such as signal interference or shortage caused by excessive density of the IC.

SUMMARY

A wafer level array of chips, a chip package, and a method of wafer level chip package are provided. Special topography is formed between the chips such that a circuit in the chip could be disposed at an edge of the chip, an inter-chip trench, without affecting following cutting process. Therefore, available space for integrated circuits within a chip could be further increased. Accordingly, issues such as signal interference or shortage caused by excessive density of the integrated circuits could be significantly improved.

The present disclosure, in one aspect, relates to a method of wafer level chip package. The method includes providing a semiconductor wafer having at least two adjacent chips and a carrier layer covering the chips, each chip having at least one device and at least one extending-line disposed in at least one extending-line protection area in the semiconductor wafer. The method further includes litho-etching a backside of the semiconductor wafer to form at least two recesses between the chips. The method further includes overall etching the backside of the semiconductor wafer to expand the recesses such that the recesses merging as an inter-chip trench, and exposing the extending-line protection area to form at least one extending-line protection.

In various embodiments of the present disclosure, after the operation of overall etching the backside of the semiconductor wafer, the method further includes sequentially forming an isolation layer, a conducting layer, a packaging layer, and at least one solder ball on the backside of the semiconductor wafer to form chip packages. The method further includes cutting along a scriber line between the chips from the backside of the semiconductor wafer to separate the chip packages. The scriber line is not overlapped with the extending-line.

In various embodiments of the present disclosure, wherein the operation of litho-etching the backside of the semiconductor wafer forms two recesses between the two chips. The operation of overall etching the backside of the semiconductor wafer forms an extending-line protection, and the scriber line is overlapped with the extending-line protection.

In various embodiments of the present disclosure, wherein the operation of litho-etching the backside of the semiconductor wafer forms three recesses. The operation of overall etching the backside of the semiconductor wafer forms two extending-line protections, and the scriber line is disposed between the two extending-line protections without being overlapped with any one of the extending-line protections.

In various embodiments of the present disclosure, wherein a ratio of a thickness of the extending-line protection and that of the chip is substantially 0.05-0.1.

In various embodiments of the present disclosure, between the operation of providing the semiconductor wafer and the operation of litho-etching the backside of the semiconductor wafer, the method further includes attaching a carrier substrate on the carrier layer.

In various embodiments of the present disclosure, wherein the carrier substrate is a glass substrate.

In various embodiments of the present disclosure, wherein the device comprises an integrated circuit device, a photovoltaic device, a micro-electromechanical device or a surface acoustic wave (SAW) device.

In various embodiments of the present disclosure, wherein the carrier layer comprises silicon oxide, silicon nitride, or silicon oxynitride.

The present disclosure, in another aspect, relates to a wafer level array of chips. The wafer level array of chips includes a semiconductor wafer, and at least one extending-line protection. The semiconductor wafer has at least two adjacent chips and a carrier layer. Each chip has an upper surface and a lower surface, the chip has at least one device on the upper surface, and the carrier layer covering the upper surface of each chip. The extending-line protection is disposed below the carrier layer and between the chips, and a thickness of the extending-line protection is less than that of the chip. The extending-line protection has at least one extending-line.

In various embodiments of the present disclosure, wherein a portion of the extending-line is electrically connected to the device through the carrier layer.

In various embodiments of the present disclosure, wherein the extending-line is an independent circuit without being electrically connected to the device.

In various embodiments of the present disclosure, the wafer level array of chips further includes at least one scriber line positioned between the chips, wherein the scriber line is not overlapped with the extending-line.

In various embodiments of the present disclosure, each chip further includes a connecting pad structure, a plurality of vias, an isolation layer, a conducting layer, and a packaging layer. The connecting pad structure is electrically connected to the device. The plurality of vias extends from the lower surface to the upper surface. The vias contacts to the connecting pad structure and exposes a part of the connecting pad structure. The isolation layer extends from the lower surface to the upper surface, and a part of the isolation layer is disposed in the vias. The conducting layer is disposed below the isolation layer and extends from the lower surface to the upper surface, a part of the conducting layer is disposed in the vias, wherein the part of the conducting layer is electrically connected to the device through the connecting pad structure. The packaging layer is disposed below the conducting layer.

In various embodiments of the present disclosure, wherein a ratio of a thickness of the extending-line protection and that of the chip is substantially 0.05-0.1.

In various embodiments of the present disclosure, wherein the device includes an integrated circuit device, a photovoltaic device, a micro-electromechanical device or a surface acoustic wave (SAW) device.

In various embodiments of the present disclosure, wherein the carrier layer includes silicon oxide, silicon nitride, or silicon oxynitride.

The present disclosure, in another aspect, relates to a chip package. The chip package includes a carrier layer, a semiconductor chip, a plurality of vias, an isolation layer, a conducting layer, a packaging layer, and at least one extending-line. The carrier layer has an active area and a periphery area surrounding the active area. The semiconductor chip is disposed in the active area and below the carrier layer. The semiconductor has an upper surface and a lower surface. The semiconductor has at least one device dispose on the upper surface and covered by the carrier layer, and at least one connecting pad structure electrically connected to the device. The plurality of vias extends from the lower surface to the upper surface. The vias contacts the connecting pad structure and exposing a part of the connecting pad structure. The isolation layer extends from the lower surface to the upper surface. A part of the isolation layer is disposed in the vias. A conducting layer is disposed below the isolation layer and extending from the lower surface to the upper surface. A part of the conducting layer is disposed in the vias, wherein the part of the conducting layer is electrically connected to the device through the connecting pad structure. The packaging layer is disposed below the conducting layer. The extending-line protection is corresponding to the periphery area and disposed below the carrier layer. The extending-line is disposed in the extending-line protection.

In various embodiments of the present disclosure, wherein a part of the extending-line is electrically connected to the device through the carrier layer.

In various embodiments of the present disclosure, wherein the extending-line is an independent circuit without being electrically connected to the device.

In various embodiments of the present disclosure, wherein a ratio of a thickness of the extending-line protection and that of the chip is substantially 0.05-0.1.

In various embodiments of the present disclosure, wherein the device comprises an integrated circuit device, a photovoltaic device, a micro-electromechanical device or a surface acoustic wave (SAW) device.

In various embodiments of the present disclosure, wherein the carrier layer comprises silicon oxide, silicon nitride, or silicon oxynitride.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 2C is a cross-sectional view according to other embodiment of the present disclosure.

FIG. 2E is a cross-sectional view according to other embodiment of the present disclosure.

FIG. 2F is a cross-sectional view according to other embodiment of the present disclosure.

FIG. 3 is a portion of a chip package according to the first embodiment of the present disclosure.

FIG. 9 is a portion of a chip package according to the second embodiment of the present disclosure.

FIG. 10 to FIG. 13 are illustrating different stages of a method of wafer level chip package according to the first embodiment of the present disclosure.

DETAILED DESCRIPTION

Figure 1A:
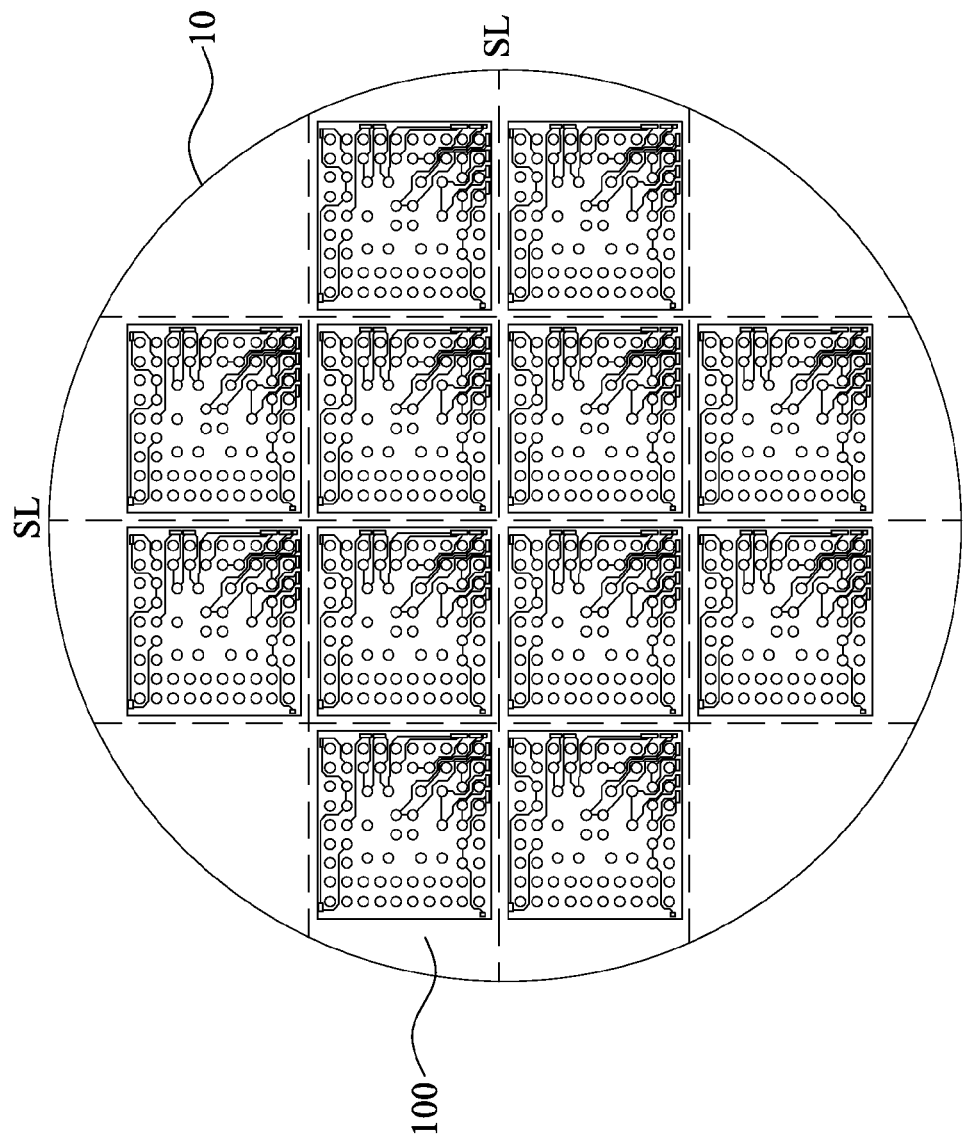
FIG. 1A is a top-view of a semiconductor wafer with a chip array and scribe lines.
Figure 1B:
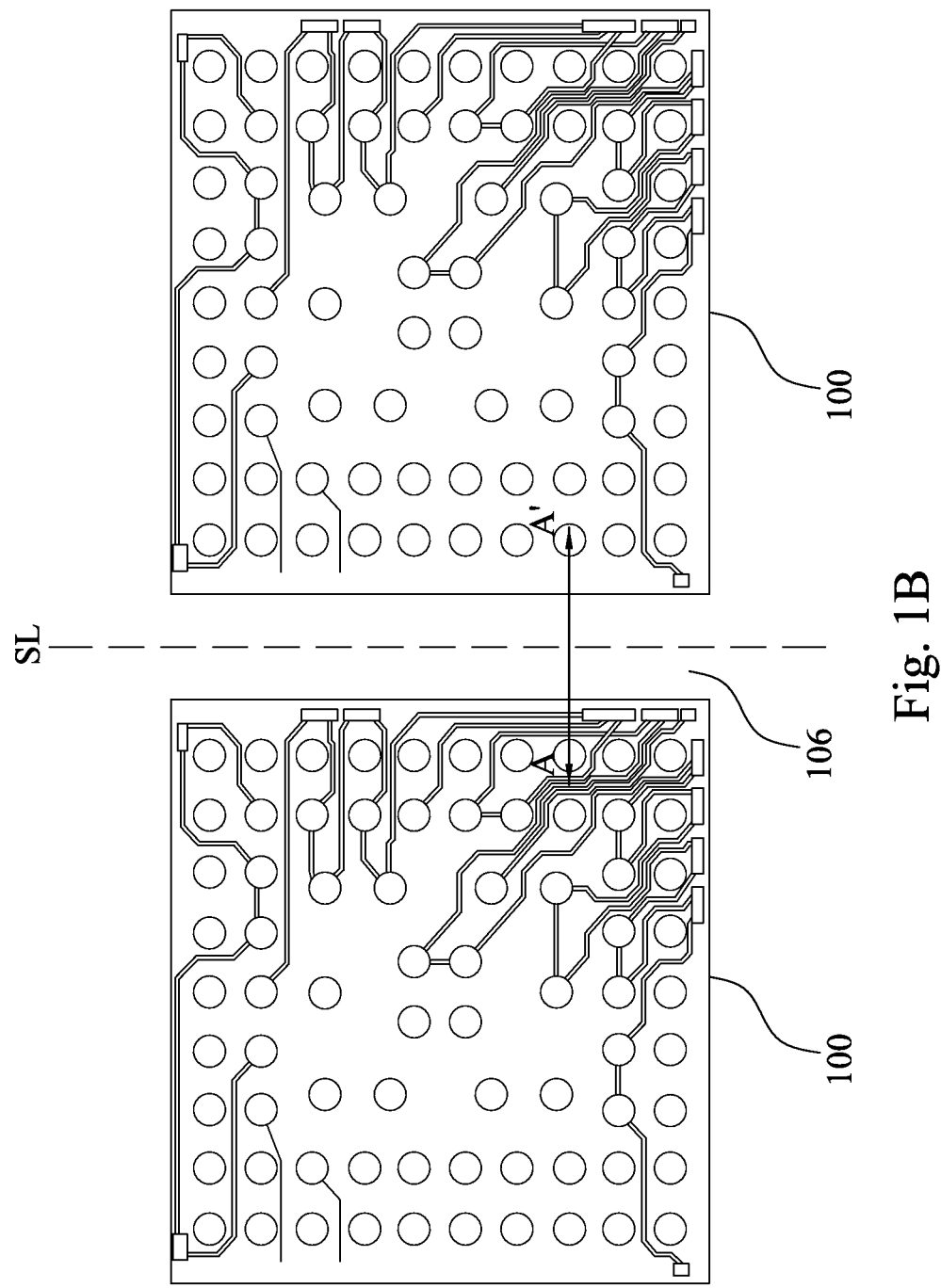
FIG. 1B is a portion of FIG. 1A.
Figure 1C:
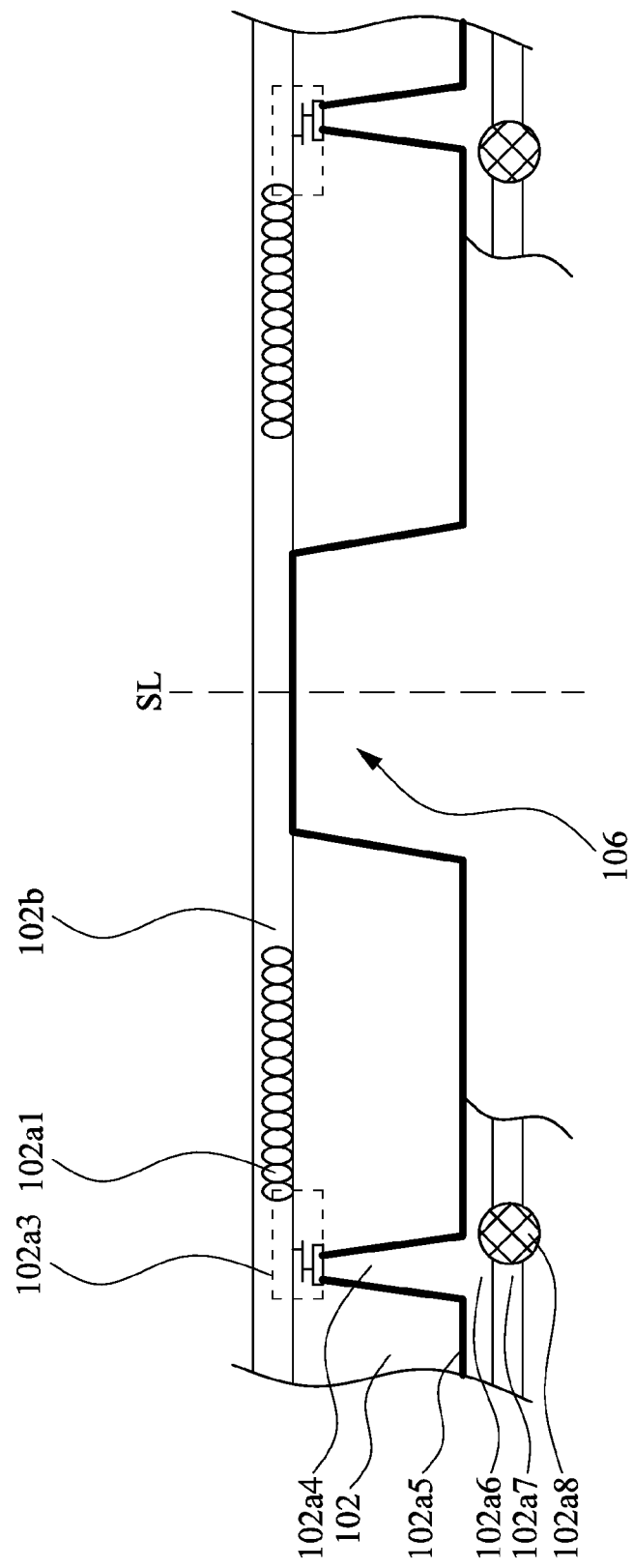
FIG. 1C is a cross-sectional view of AA' line in FIG. 1B.

Reference will now be made in detail to the present embodiments of the invention, examples of which are illustrated in the accompanying drawings. Wherever possible, the same reference numbers are used in the drawings and the description to refer to the same or like parts.

Figure 2A:
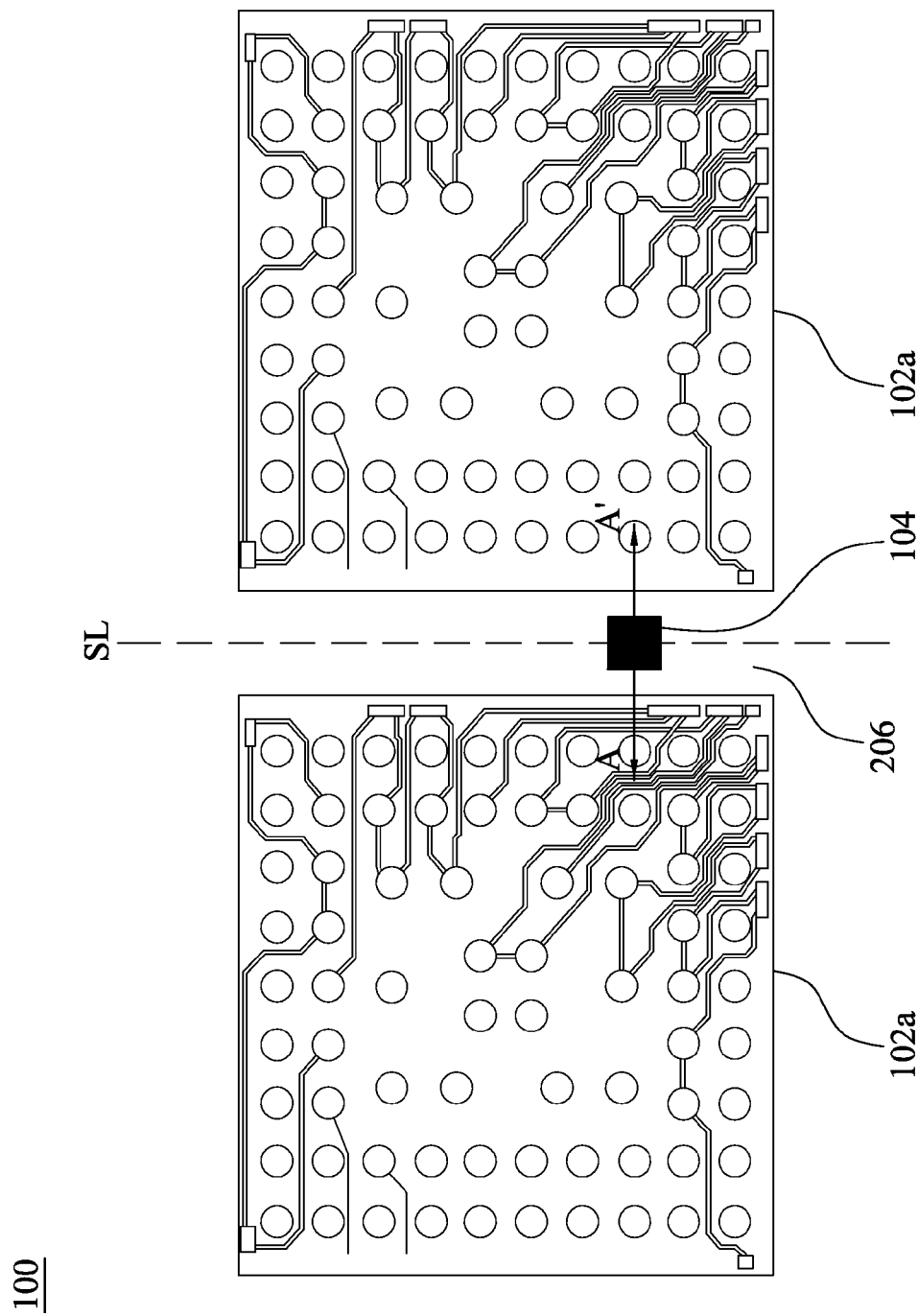
FIG. 2A is a portion of the semiconductor wafer with the chip array according to the first embodiment of the present disclosure.
Figure 2B:
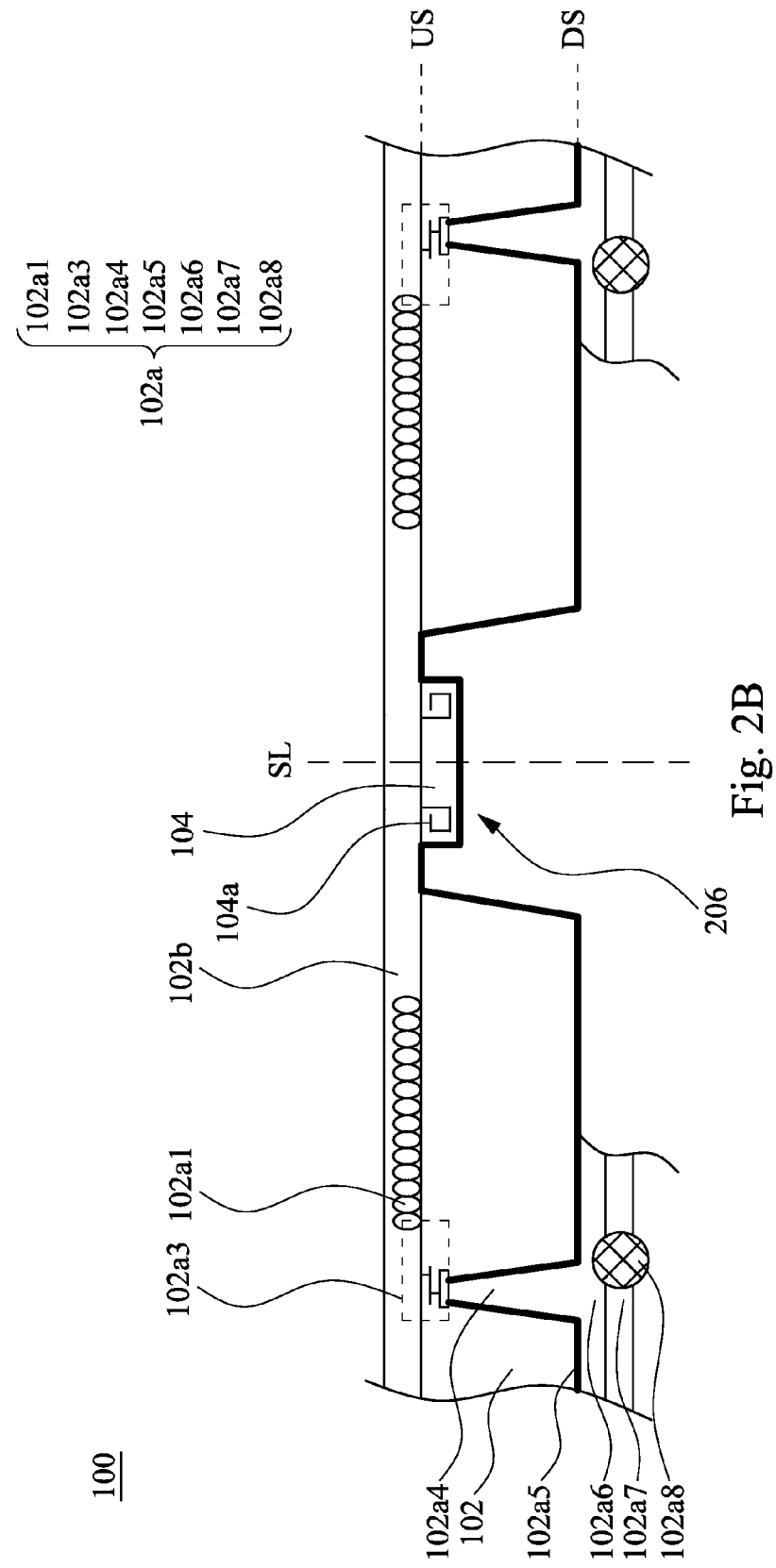
FIG. 2B is a cross-sectional view of AA' line in FIG. 2A.

FIG. 2A is a portion of the semiconductor wafer with the chip array according to the first embodiment of the present disclosure. FIG. 2B is a cross-sectional view of AA' line in FIG. 2A.

Referring to FIG. 2A and FIG. 2B, a wafer level array of chips 100 according to the first embodiment of the present disclosure includes a semiconductor wafer 102 and at least one extending-line protection 104. As illustrated in FIG. 2A, the semiconductor wafer 102 has at least two adjacent chips 102a. The extending-line protection 104 is disposed between the two adjacent chips 102a. As illustrated in FIG. 2B, the semiconductor wafer 102 also includes the carrier layer 102b. Each chip 102a has an upper surface US and a lower surface DS. Each chip 102a has a device 102a1 disposed on the upper surface US of the chip 102a. The carrier layer 102b covers the upper surfaces US of the chips 102a. Therefore, device 102a1 of the chip 102a could be protected by the carrier layer 102b. The carrier layer 102b may be silicon oxide, silicon nitride, or silicon oxynitride. However, the present disclosure is not limited thereto. The carrier layer 102b could provide functions such as air isolation or stress buffering. In various embodiments of the present disclosure, the device 102a1 includes an integrated circuit device, a photovoltaic device, a micro-electromechanical device or a surface acoustic wave (SAW) device. Referring to FIG. 2A and FIG. 2B, the extending-line protection 104 is disposed between the chips 102a. In other words, the extending-line protection 104 is disposed corresponding to the periphery area of the chip 102a. It should be noticed that the extending-line protection 104 has one or more extending-lines 104a. According to various design requirements, the extending-line 104a could be an independent circuit without being electrically connected to the device 102a1. Or the extending-line 104a could be electrically connected to the device 102a1. As illustrated in FIG. 2B, the extending-line 104a is fully covered by the extending-line protection 104 without being exposed. The extending-line 104a may include aluminum, copper, nickel, or other suitable conductive materials. However, the present disclosure is not limited thereto.

Referring to FIG. 2A and FIG. 2B, according to the first embodiments of the present disclosure, the scriber line SL between the chips 102a is overlapped with the extending-line protection 104, but is not overlapped with the extending-line 104a. Therefore, the extending-line protection 104 between the chips 102a could be cut to separate the chips 102a without exposing the extending-lines 104a, which are still respectively covered by the separated extending-line protections 104. In various embodiments of the present disclosure, a thickness of the extending-line protection 104 may be 5%-10% of a thickness of the chip 102a. Therefore, cutters could enter easily and divided the extending-line protection 104 into smaller parts which are respectively belong to adjacent chips 102a. FIG. 3 is a portion of a chip package according to the first embodiment of the present disclosure. As illustrated in FIG. 3, a single chip package 100 has a part of the extending-line protection 104, and the extending-line 104a is disposed in the extending-line protection 104.

Figure 2D:
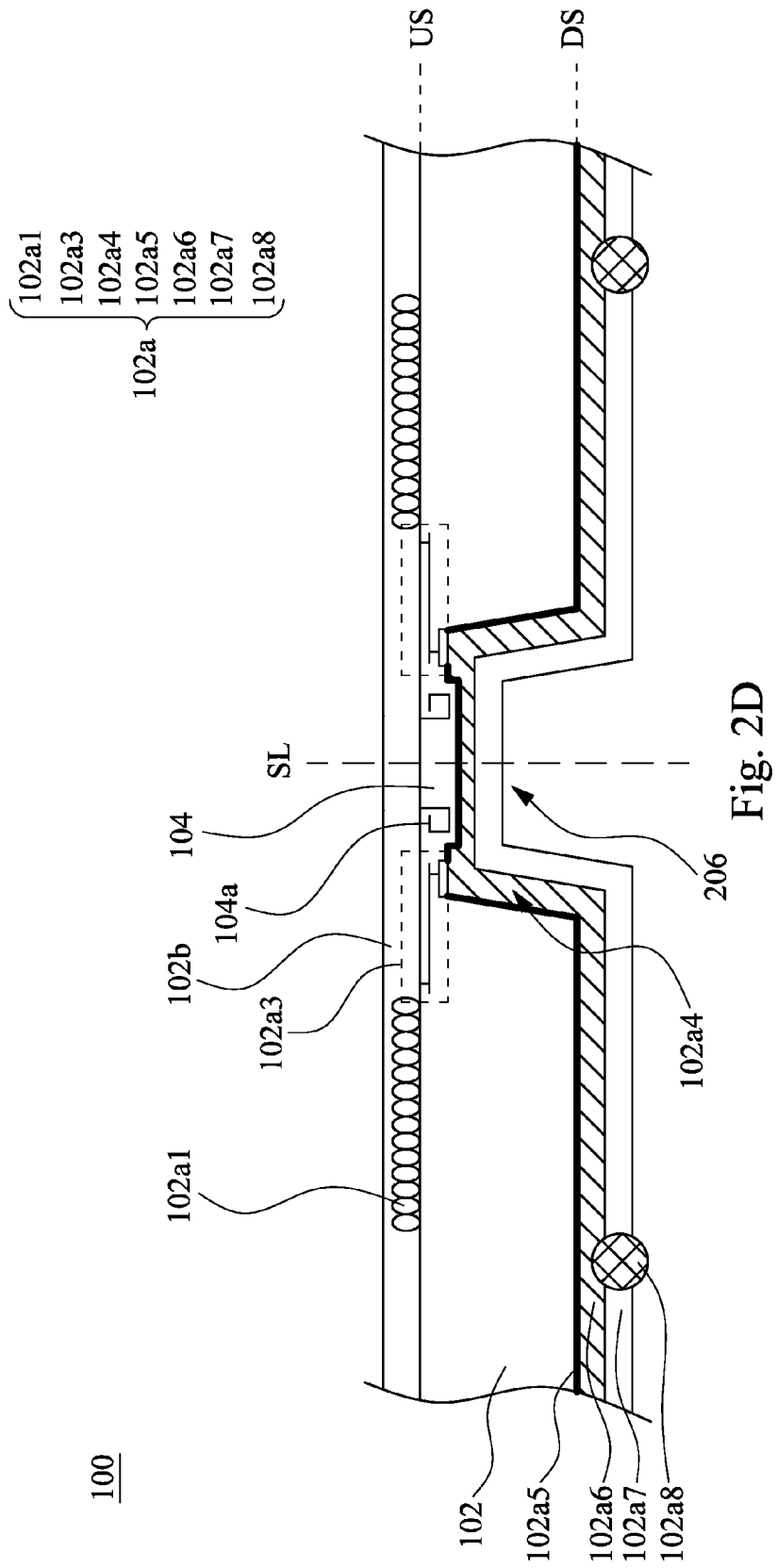
FIG. 2D is a cross-sectional view according to other embodiment of the present disclosure.
Figure 2G:
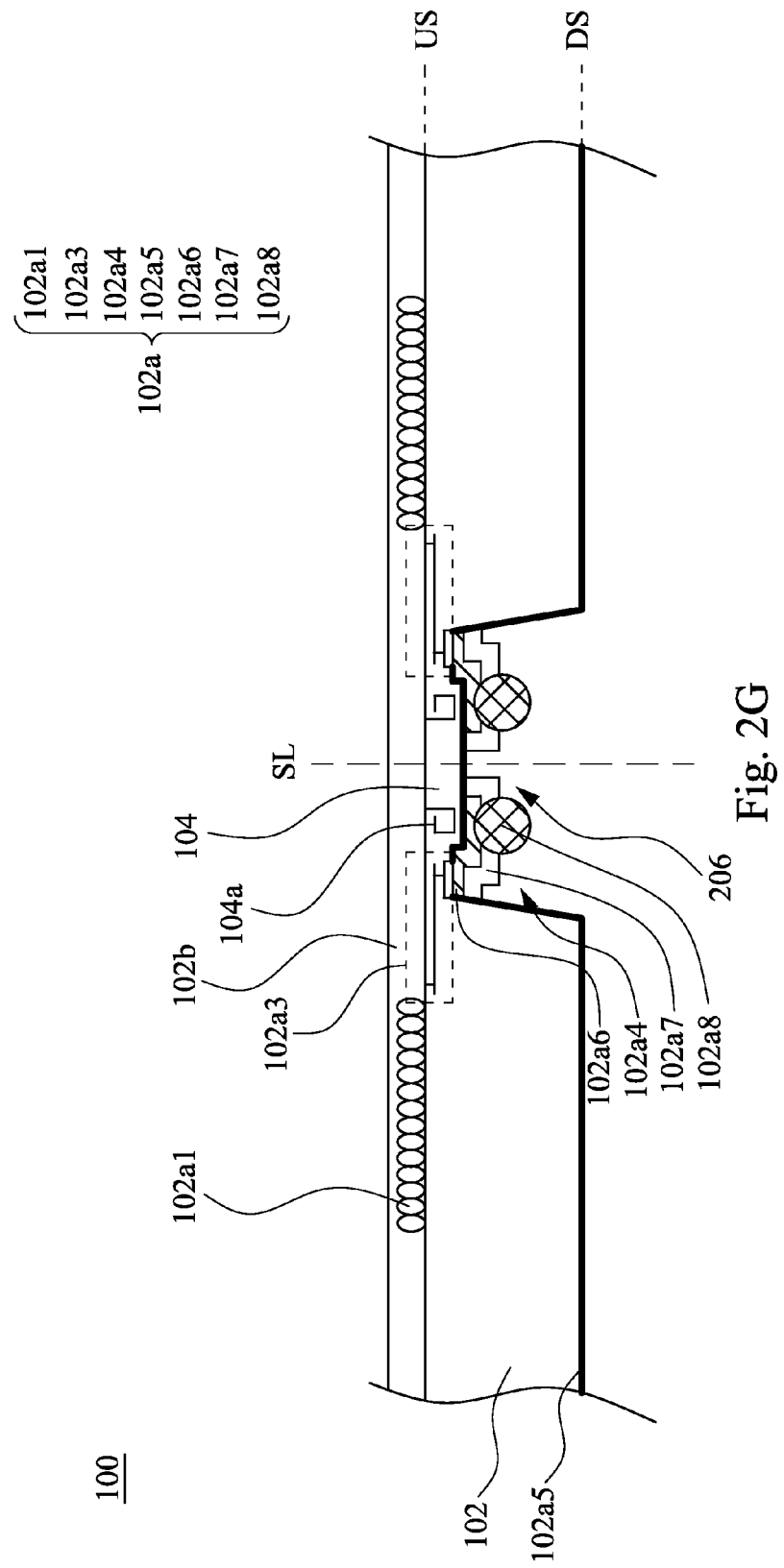
FIG. 2G is a cross-sectional view according to other embodiment of the present disclosure.
Figure 2H:
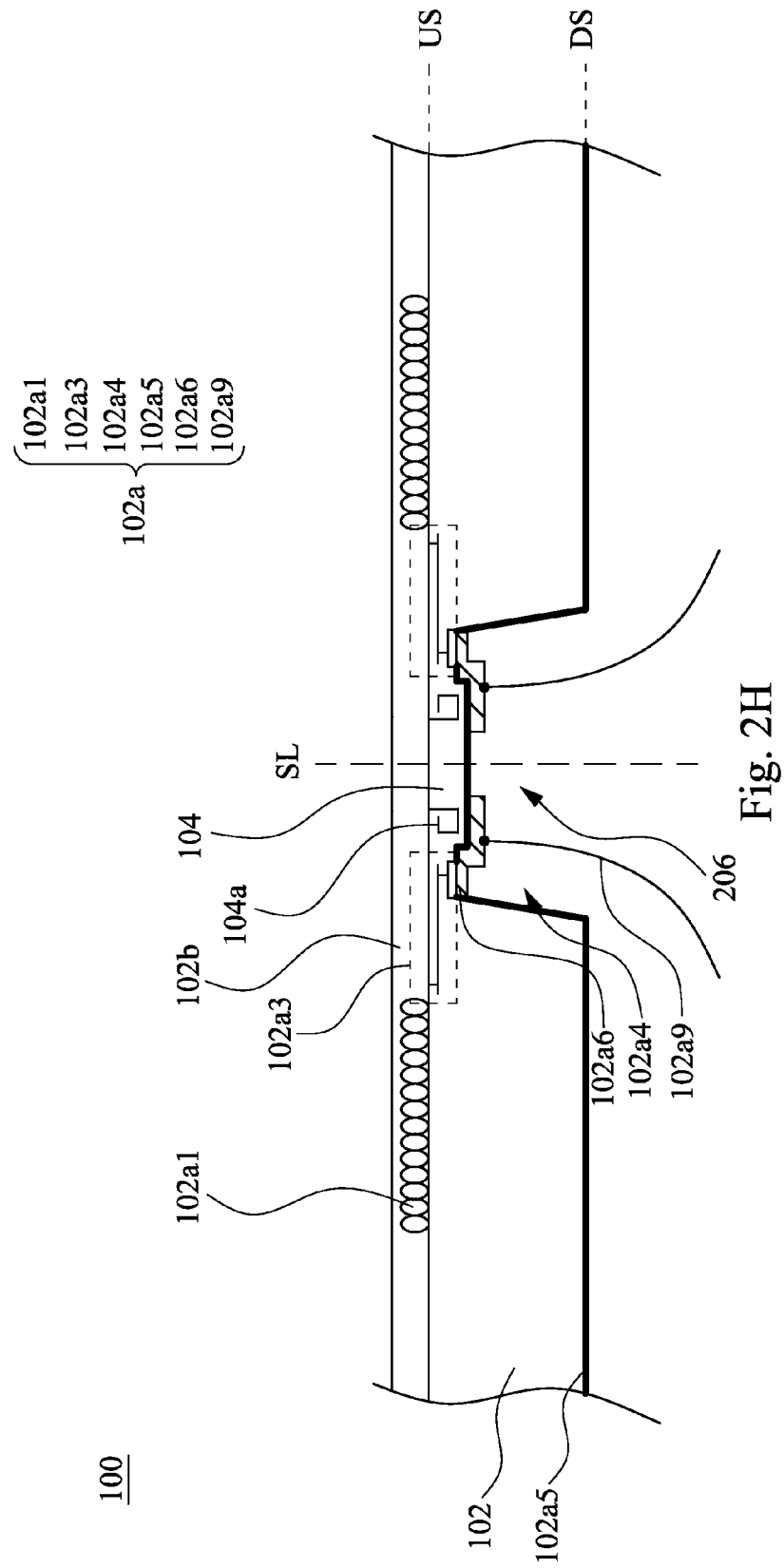
FIG. 2H is a cross-sectional view according to other embodiment of the present disclosure.

In addition, each chip 102a could be packaged as the chip package 100 illustrated in FIG. 3. The chip 102a may further include a connecting pad structure 102a3, a plurality of vias 102a4, an isolation layer 102a5, a conducting layer 102a6, a packaging layer 102a7, and a solder ball 102a8. However, the present disclosure is not limited thereto. The connecting pad structure 102a3 is electrically connected to the device 102a1. The connecting pad structure 102a3 extends from the upper surface US of the chip 102a to the lower surface DS of the chip 102. As illustrated in FIG. 2B, the connecting pad structure 102a3 is electrically connected to the device 102a1. The connecting pad structure 102a3 may be an interconnection structure. The interconnection structure extends from the upper surface US of the chip 102a to the lower surface DS of the chip 102a, and is disposed in the chip 102a. Therefore, the device 102a1 is electrically connected to the connecting pad structure 102a3 through the interconnection structure. However, the present disclosure is not limited thereto. Referring to FIG. 2B, the plurality of vias 102a4 extends from the lower surface DS of the chip 102a to the upper surface US of the chip 102a so as to contact the connecting pad structure 102a, which is disposed in the chip 102a, and to expose a part of the connecting pad structure 102a3. In other words, the plurality of vias 102a4 is through-silicon via (TSV) as a vertical conducting path from the lower surface DS of the chip 102a to the upper surface US of the chip 102a when following conducting layer 102a6 is filled in. Referring to FIG. 2B, the isolation layer 102a5 covers the lower surface DS of the chip 102a. The isolation layer 102a5 may be silicon oxide, silicon nitride, silicon oxynitride, or other suitable insulation materials. The isolation layer 102a5 also extends from the plurality of vias 102a4 to the upper surface US of the chip 102a so that a part of the isolation layer 102a5 is disposed on sidewalls of the plurality of vias 102a4. The conducting layer 102a6 is disposed below the isolation layer 102a5. The conducting layer 102a6 may include aluminum, copper, nickel, or other suitable conducting materials. The conducting layer 102a6 has a predetermined pattern. For example, as aforementioned conducting materials are deposited to form a film, the film is patterned by litho-etching processes to form the predetermined pattern. The predetermined pattern of the conducting layer 102a6 is disposed below the isolation layer 102a5, and is corresponding to the plurality of vias 102a4. The conducting layer 102a6 also extends from the lower surface DS of the chip 102a to the upper surface US of the chip 102a. A part of the conducting layer 102a6 is disposed in the plurality of vias 102a4, and fulfills the plurality of vias 102a4. Therefore, the conducting layer 102a6 disposed in the plurality of vias 102a4 contacts the connecting pad structure 102a3 in the chip 102a, and the conducting layer 102a6 is electrically connected to the device 102a1 through the connecting pad structure 102a3. As illustrated in FIG. 2B, the packaging layer 102a7 is disposed below the conducting layer 102a6. The packaging layer 102a7 may be solder mask or other packaging materials. The packaging layer 102a7 has an opening to expose a part of the conducting layer 102a6. The exposed part of the conducting layer 102a6 is electrically connected solder balls 102a8. The packaging layer 102a7 prevents the solder balls 102a8 from contacting each other and being short. The packaging layer 102a7 also protects the conducting layer 102a6. The solder ball 102a8 is disposed below the packaging layer 102a7. The solder ball 102a8 is electrically connected to the conducting layer 102a6, which is partially exposed through the opening of the packaging layer 102a7. The solder ball 102a8 may be tin (Sn) or other suitable soldering materials. FIG. 2D-2H are cross-sectional views according to various other embodiments of the present disclosure. The connecting pad structure 102a3 of the chip 102a could be disposed on a periphery area, which is overlapped with the scriber lines SL. The connecting pad structure 102a3 is exposed by the via 102a, which is also disposed on the periphery area. As illustrated in FIG. 2C, FIG. 2D, and FIG. 2G, the exposed connecting pad structure 102a3 is electrically connected with the solder ball 102a8. As illustrated in FIG. 2E, FIG. 2F, and FIG. 2H, the exposed connecting pad structure 102a3 is electrically connected with a bonding wire 102a9. As to the details of the isolation layer 102a5, the conducting layer 102a6, and the packaging layer 102a7 are similar to those described above, and therefore the details are omitted here.

As aforementioned, the scriber line SL is overlapped with the periphery area, as an inter-chip trench 206 shown in FIG. 2B. The inter-chip trench 206 is an open area, which is formed by etching a backside of the semiconductor wafer 10. The inter-chip trench 206 is formed for the cutter to enter and separate the adjacent chips 102a. As the integrated density within a chip is increasing, available space of the chip for integrated circuit has to be accordingly increased. According to the first embodiment of the present disclosure, a special topography of the inter-chip trench 206 between the adjacent chips 102a is formed. In other words, the extending-line protection 104 with a thinner thickness is disposed in the inter-chip trench 206 between the adjacent chips 102a. Under the premise of not affecting the cutting processes, the extending-line 104 as a part of the integrated circuit in the chip 102a could be disposed in the extending-line protection 104 at the edge of the chip 102a. The extending-line 104 is covered and protected by the extending-line protection 104 in the inter-chip trench 206. In various embodiments of the present disclosure, a portion of the extending-line 104 is electrically connected to the device 102a1 through the carrier layer 102b. Therefore, more space is available for disposing the circuits such that issues of signal interference or shortage caused by excessive density of the integrated circuits could be improved. In other various embodiments of the present disclosure, the extending-line 104 is an independent circuit without being electrically connected to the device 102a1. Therefore, the extending-line 104 could be designed to have other special functions.

FIG. 4 to FIG. 7 illustrate different stages of a method of wafer level chip package according to the first embodiment of the present disclosure. Corresponding to aforementioned FIG. 2A and FIG. 2B, FIG. 4 to FIG. 7 also illustrate two adjacent chips 102a as an unit for the following description. However, illustration of FIG. 4 to FIG. 7 could be analogized to all chips 102a on the whole wafer.

Figure 4:
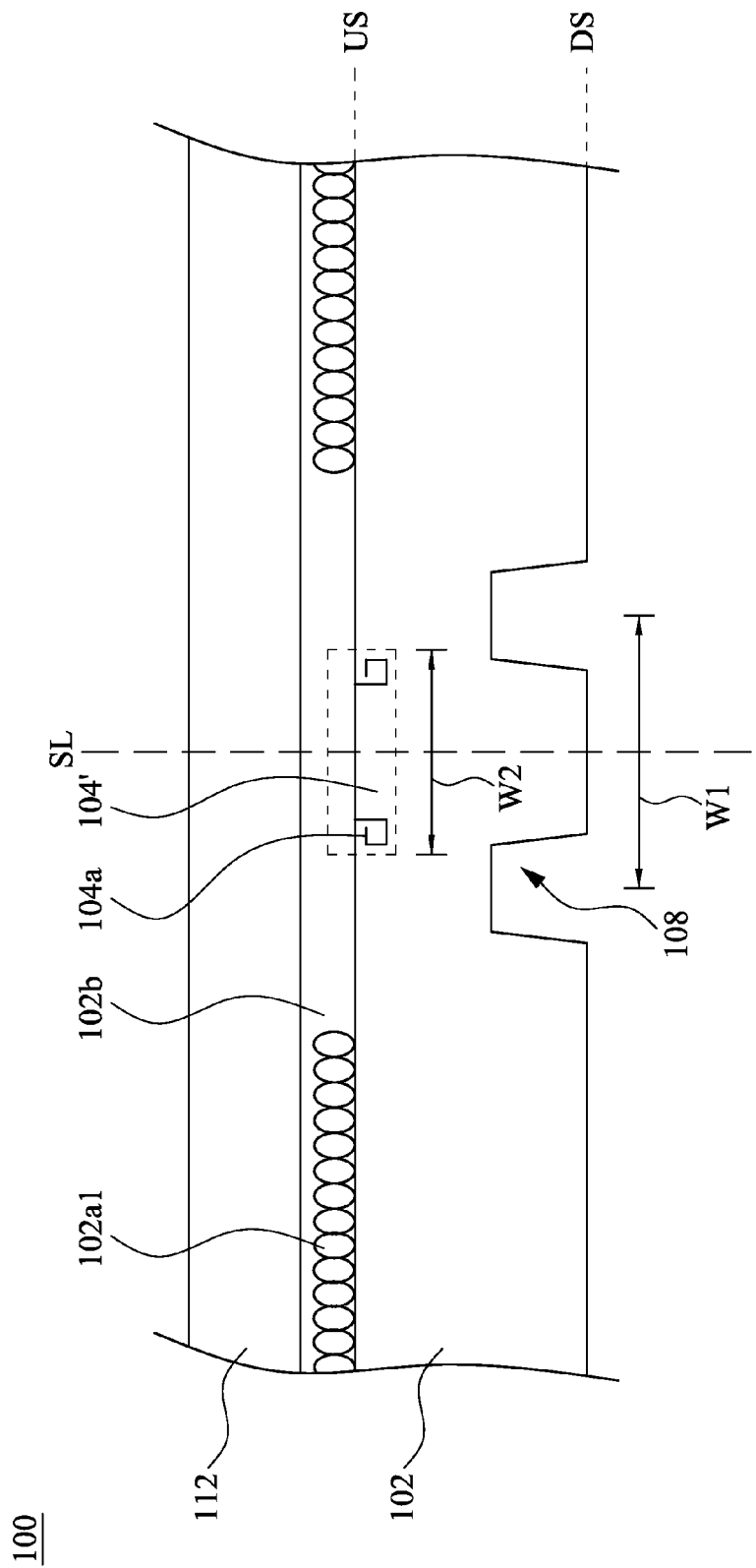
FIG. 4 to FIG. 7 are illustrating different stages of a method of wafer level chip package according to the first embodiment of the present disclosure.

FIG. 4 is a cross-sectional view of a portion of the wafer level array of chips 100 in an intermediate stage of manufacturing according to the first embodiment of the present disclosure. Referring to FIG. 4, a semiconductor wafer 102 is provided. The semiconductor wafer 102 has at least two adjacent chips 102a. Also as shown in FIG. 2B, the semiconductor wafer 102 further includes a carrier layer 102b, and each chips 102a has an upper surface US and a lower surface DS. Each chip 102a has a device 102a1 and an extending-line 104a. The device 102a1 and the extending-line 104a are disposed on the upper surface US of the chip 102a, and are covered by the carrier layer 102b. The extending-line 104a could be electrically connected to the device 102a1, or an independent circuit without being electrically connected to the device 102a1. As shown in FIG. 4, the extending-line 104a is disposed between the chips 102a. In other words, the extending-line 104a is disposed around the scriber line SL. It should be noticed that the extending-line 104a corresponding to the chip 102a is disposed in the extending-line protection area 104', and the extending-line 104a does not exceed the boundary (scriber line SL) of the chip 102a. The extending-line protection area 104' has a width w2. The width w2 could be optimized according to actual requirement of space for integrated circuit in the semiconductor wafer 102. In addition, a carrier substrate 112 is optional to be attached on the carrier layer 102b. The carrier substrate 112 could fix and support the chips 102a on the semiconductor wafer 102 in following processes. The carrier substrate 112 could be a glass substrate. However, the present disclosure is not limited thereto. Next, a backside of the semiconductor wafer 102 is litho-etched to form two recesses 108 between the chips 102a. As illustrated in FIG. 4, a distance w1 between two recesses 108 is substantially greater than w2. The distance w1 is coped with w2, and is precisely controlled by litho-etching processes.

Figure 5:
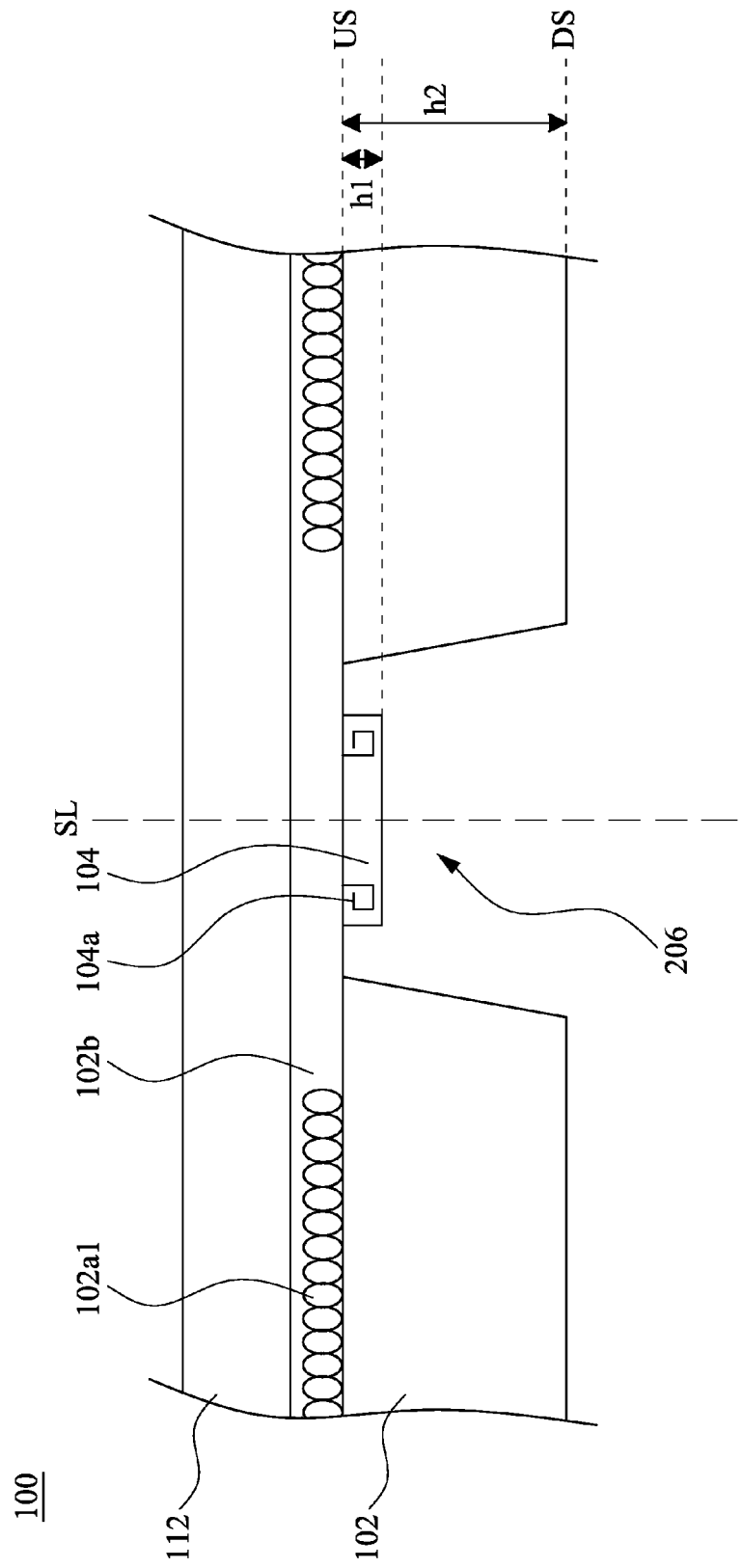

Referring to FIG. 5, the backside of the semiconductor wafer 102 is overall etched to expand the recesses 108 such that the recesses 108 merging as an inter-chip trench 206, and exposing the extending-line protection area to form one extending-line protection 104a. It should be noticed that the extending-line 104a is still covered in the extending-line protection 104 without being exposed. A thickness of the chip 102a after the operation of overall etching the backside of the semiconductor wafer 102 is h2, and a thickness of the extending-line protection 104 after the operation of overall etching the backside of the semiconductor wafer 102 is h1. In order to smoothly separate the chips 102a in following cutting process, a ratio of the thickness h1 of the extending-line protection 104 and the thickness h2 of the chip 102a is substantially 0.05-0.1. The ratio could be well controlled by selecting proper parameters of the operation of overall etching the backside of the semiconductor wafer 102. The parameters, for example, could include etchants selection, etching time or other possible variables. It should be noticed that the operation of litho-etching the backside of the semiconductor wafer to form at least two recesses is coped with the operation of overall etching the backside of the semiconductor wafer to expand the recesses so as to form a special topography (h2 greater than h1) of the inter-chip trench 206 according to the first embodiment of the present disclosure. In general, forming such a special topography requires two operations of litho-etching. According to the method of the present disclosure, a loading effect, which is a process variation frequently occurred in etching process, is utilized to form the special topography of the inter-chip trench 206 of the first embodiment of the present disclosure. When the loading effect occurs, an etching rate of a portion having larger exposed area is slower than that of a portion having smaller exposed area. As illustrated in FIG. 4, two recesses 108 are formed between two adjacent chips 102a in the operation of litho-etching the backside of the semiconductor wafer 102 such that the exposed area of the semiconductor wafer 102 between two recesses 108 is larger than that of the other part of semiconductor wafer 102. Therefore, in the following operation of overall etching the backside of the semiconductor wafer 102, an etching rate of the exposed area of the semiconductor wafer 102 between two recesses 108 is larger than that of the exposed area of the other part of semiconductor wafer 102. Accordingly, the special topography (h2 greater than h1) of the inter-chip trench 206 according to the first embodiment of the present disclosure is formed without extra litho-etching process. Given above, the method of the first embodiment of the present disclosure has simpler sequences, and does not require an extra photomask. Therefore, the cost could be significantly reduced.

Figure 6:
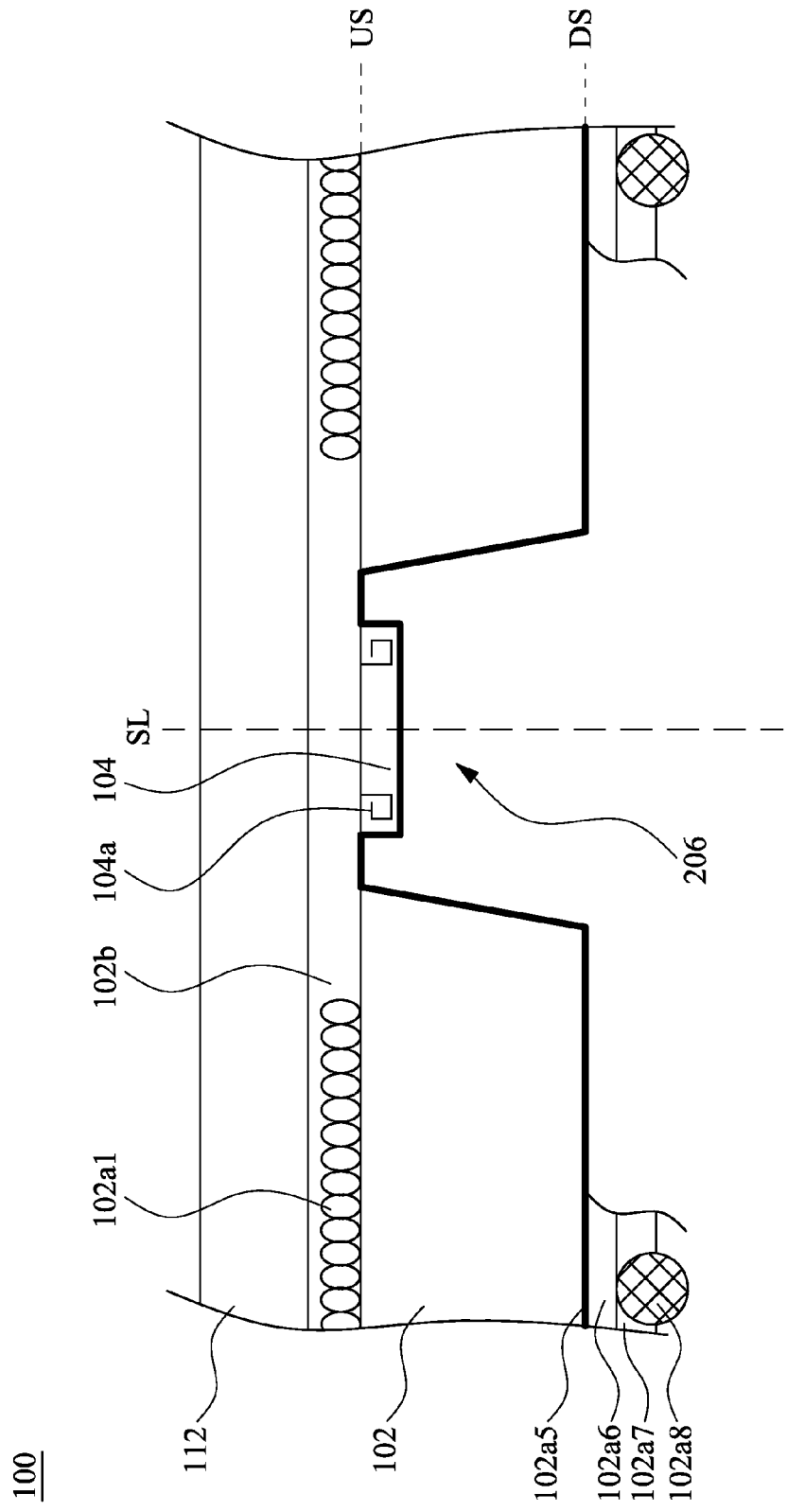
Figure 7:
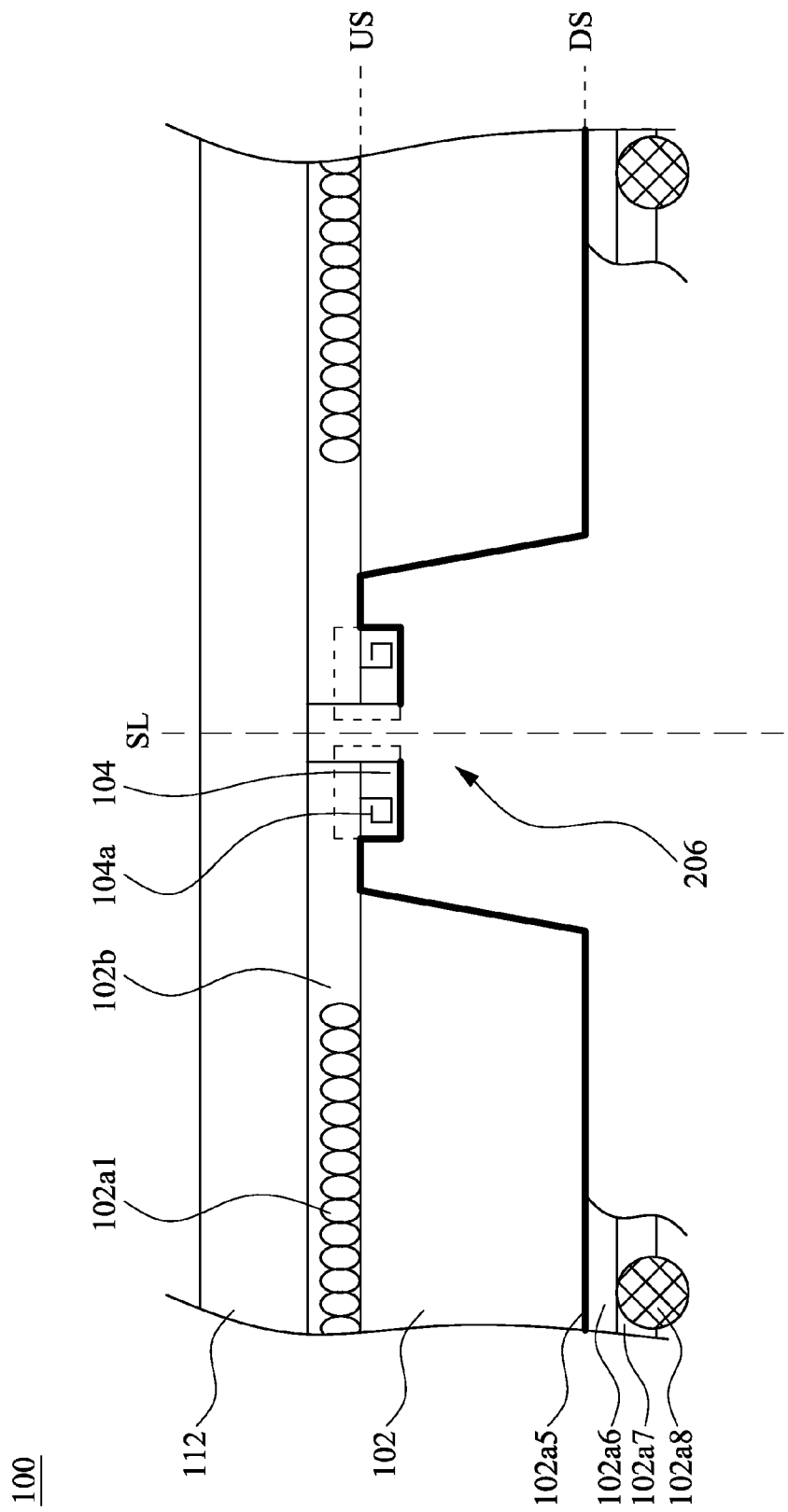

In addition, after the operation of overall etching the backside of the semiconductor wafer 102, the method further includes sequentially forming an isolation layer 102a5, a conducting layer 102a6, a packaging layer 102a7, and at least one solder ball 102a8 on the backside of the semiconductor wafer to form chip packages. As illustrated in FIG. 6, chip packages of two chips are respectively formed on the semiconductor wafer 102. As to positions and relations between the isolation layer 102a5, the conducting layer 102a6, the packaging layer 102a7, and the solder ball 102a8 are described above, and therefore the details are omitted here. Next, cutting along the scriber line SL between the chips 102a from the backside of the semiconductor wafer 102 to separate the chip packages. As illustrated in FIG. 7, it should be noticed that the scriber line SL is not overlapped with the extending-line 104a. In other words, the separated chip packages respectively has the extending-lines 104a, which is still covered and protected by the extending-line protection 104.

Figure 8A:
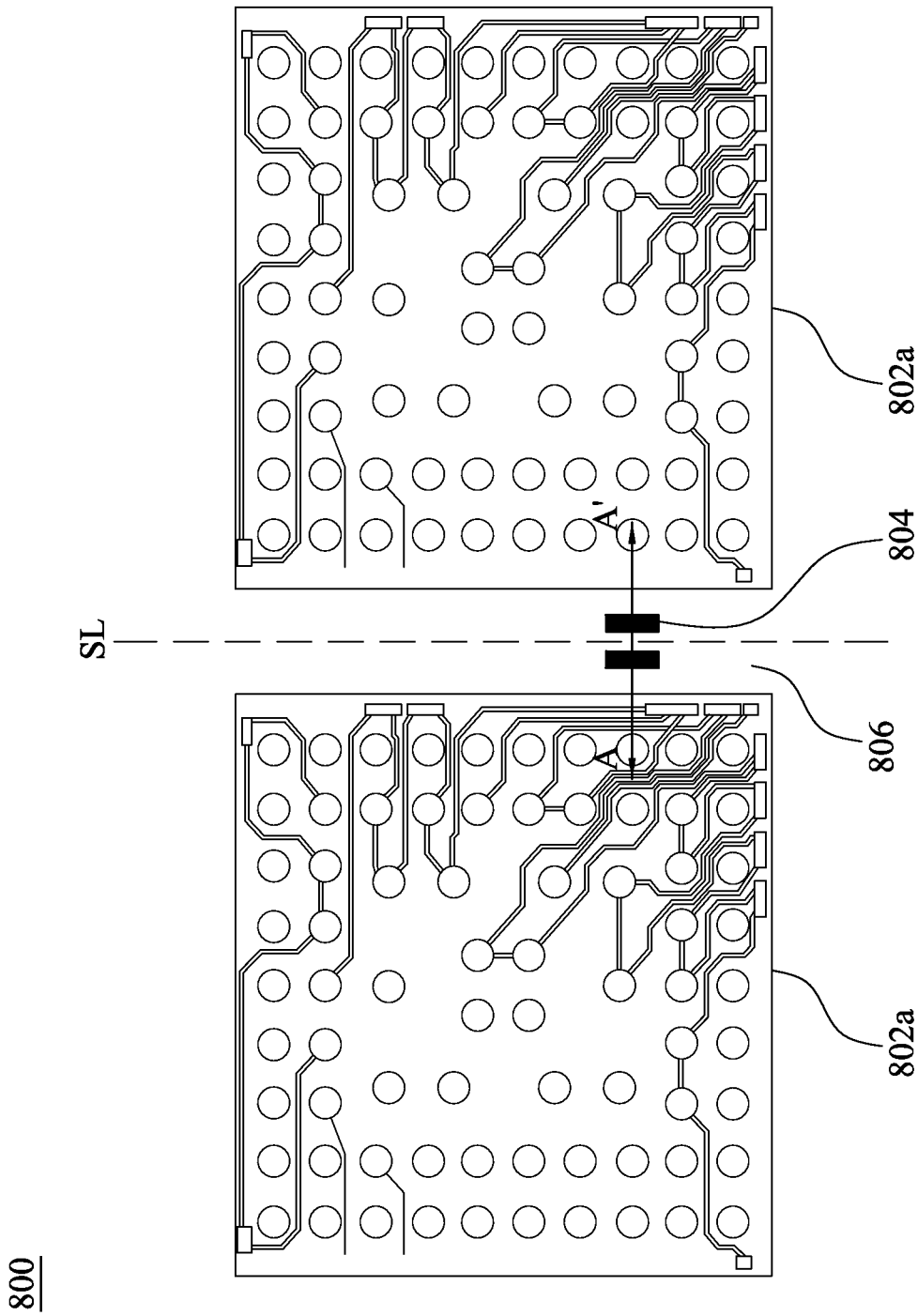
FIG. 8A is a portion of the semiconductor wafer with the chip array according to the second embodiment of the present disclosure.
Figure 8B:
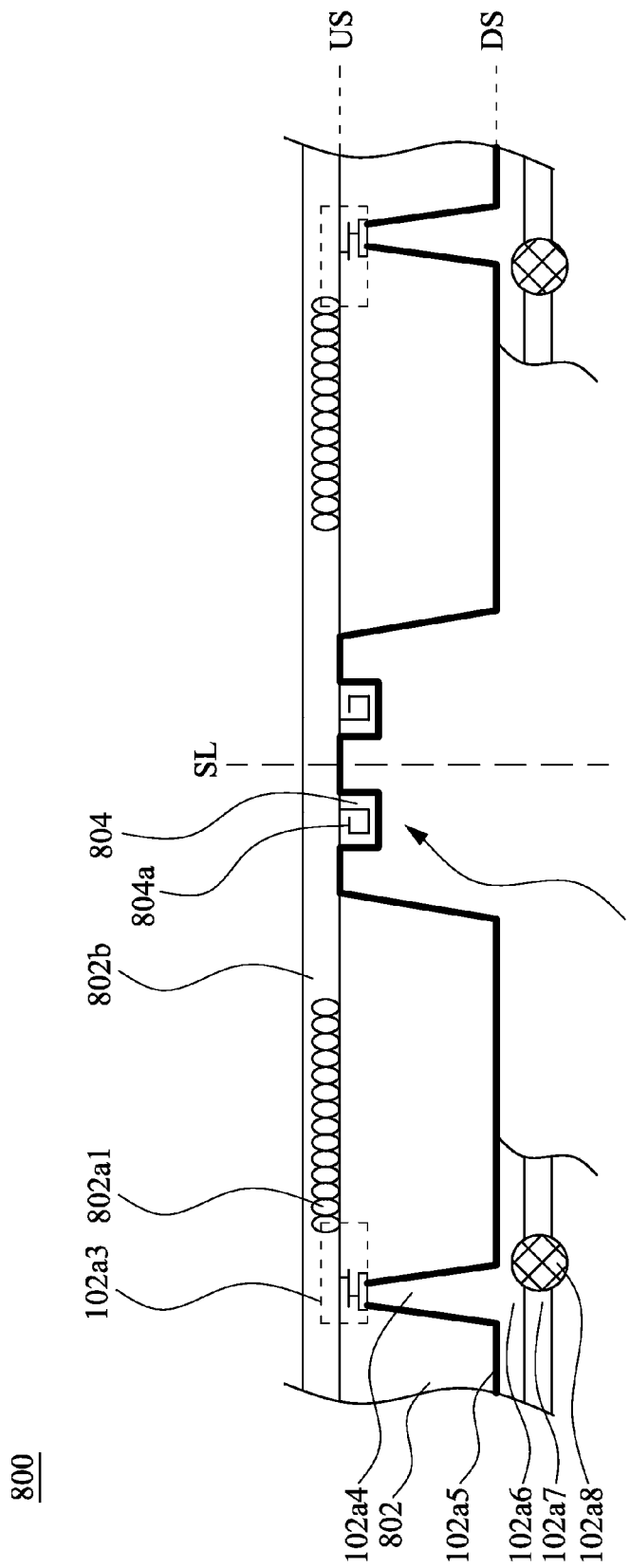
FIG. 8B is a cross-sectional view of AA' line in FIG. 8A.

FIG. 8A is a portion of the semiconductor wafer with the chip array according to the second embodiment of the present disclosure. FIG. 8B is a cross-sectional view of AA' line in FIG. 8A.

Referring FIG. 8A and FIG. 8B, Referring to FIG. 2A and FIG. 2B, a wafer level array of chips 800 according to the second embodiment of the present disclosure includes a semiconductor wafer 802 and at least one extending-line protection 804. As illustrated in FIG. 8A, the semiconductor wafer 802 has at least two adjacent chips 802a. The extending-line protection 804 is disposed between the two adjacent chips 802a. As illustrated in FIG. 8B, the semiconductor wafer 802 also includes the carrier layer 102b. Each chip 802a has an upper surface US and a lower surface DS. Each chip 802a has a device 802a1 disposed on the upper surface US of the chip 802a. The carrier layer 802b covers the upper surfaces US of the chips 802a. Therefore, device 802a1 of the chip 802a could be protected by the carrier layer 802b. The carrier layer 802b may be silicon oxide, silicon nitride, or silicon oxynitride. However, the present disclosure is not limited thereto. The carrier layer 102b could provide functions such as air isolation or stress buffering. In various embodiments of the present disclosure, the device 802a1 includes an integrated circuit device, a photovoltaic device, a micro-electromechanical device or a surface acoustic wave (SAW) device.

Referring to FIG. 8A and FIG. 8B, the extending-line protection 804 is disposed between the chips 802a. It should be noticed that the extending-line protection 804 has one or more extending-lines 804a. According to various design requirements, the extending-line 804a could be an independent circuit without being electrically connected to the device 802a1. Or the extending-line 804a could be electrically connected to the device 802a1. As illustrated in FIG. 8B, the extending-line 104a is fully covered by the extending-line protection 804 without being exposed. The extending-line 804a may include aluminum, copper, nickel, or other suitable conductive materials. However, the present disclosure is not limited thereto.

Referring to FIG. 8A and FIG. 8B, according to the second embodiments of the present disclosure, the scriber line SL between the chips 802a is not overlapped with the extending-line protections 804, but is disposed between the extending-lines 804a. In other words, the extending-line protections 804 would not be cut in the following cutting process. Therefore, the extending-lines 804a, which are still respectively covered by the separated extending-line protections 104, would not be damaged in the following cutting process. In various embodiments of the present disclosure, a thickness of the extending-line protection 804 may be 5%-10% of a thickness of the chip 802a. Therefore, cutters could enter easily. FIG. 9 is a portion of a chip package according to the second embodiment of the present disclosure. As illustrated in FIG. 9, a single chip package 800 has the extending-line protection 804, and the extending-line 804a is disposed in the extending-line protection 804.

In addition, each chip 102a could be packaged as the chip package 800 illustrated in FIG. 8B and FIG. 9. The chip package 800 may further include a connecting pad structure 102a3, a plurality of vias 102a4, an isolation layer 102a5, a conducting layer 102a6, a packaging layer 102a7, and a solder ball 102a8. However, the present disclosure is not limited thereto. As to the details of the isolation layer 102a5, the conducting layer 102a6, and the packaging layer 102a7 are similar to those described in the first embodiment of the present disclosure, and therefore the details are omitted here.

In general, the scriber line SL is overlapped with the periphery area, as an inter-chip trench 806 shown in FIG. 8B. The inter-chip trench 806 is an open area, which is formed by etching a backside of the semiconductor wafer 10. The inter-chip trench 806 is formed for the cutter to enter and separate the adjacent chips 802a. As the integrated density within a chip is increasing, available space of the chip for integrated circuit has to be accordingly increased. According to the second embodiment of the present disclosure, a special topography of the inter-chip trench 806 between the adjacent chips 802a is formed. In other words, the extending-line protection 804 with a thinner thickness is disposed in the inter-chip trench 806 between the adjacent chips 802a. Under the premise of not affecting the cutting processes, the extending-line 804 as a part of the integrated circuit in the chip 802a could be disposed in the extending-line protection 804 at the edge of the chip 802a. The extending-line 104 is covered and protected by the extending-line protection 104 in the inter-chip trench 206. In various embodiments of the present disclosure, a portion of the extending-line 804 is electrically connected to the device 802a1 through the carrier layer 802b. Therefore, more space is available for disposing the circuits such that issues of signal interference or shortage caused by excessive density of the integrated circuits could be improved. In other various embodiments of the present disclosure, the extending-line 804 is an independent circuit without being electrically connected to the device 802a1. Therefore, the extending-line 804 could be designed to have other special functions.

FIG. 10 to FIG. 13 illustrate different stages of a method of wafer level chip package according to the second embodiment of the present disclosure. Corresponding to aforementioned, FIG. 10 to FIG. 13 also illustrate two adjacent chips 802a as an unit described in FIG. 8A and FIG. 8B for the following description. However, illustration of FIG. 10 to FIG. 13 could be analogized to all chips 802a on the whole wafer.

Figure 10:
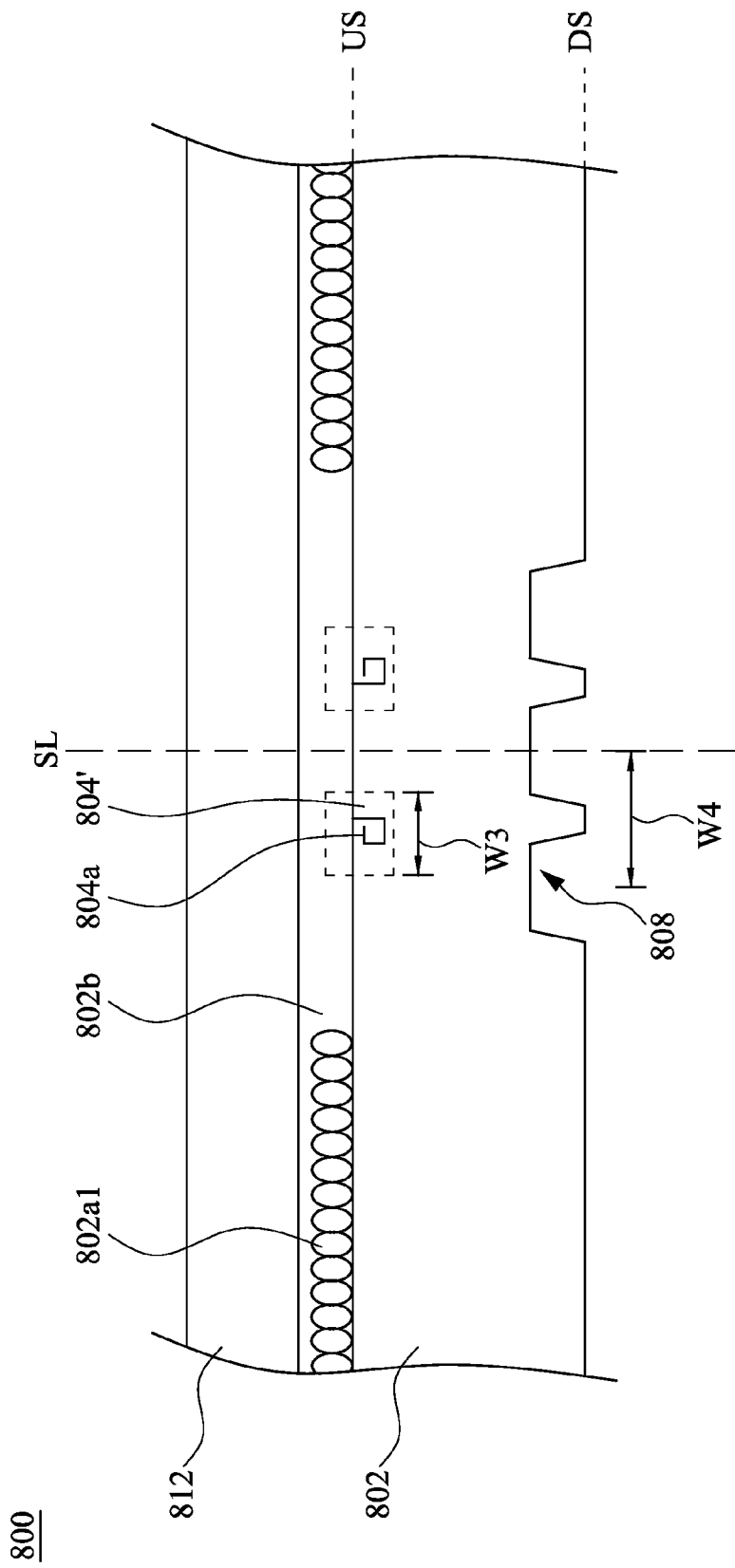

FIG. 10 is a cross-sectional view of a portion of the wafer level array of chips 800 in an intermediate stage of manufacturing according to the second embodiment of the present disclosure. Referring to FIG. 10, a semiconductor wafer 802 is provided. The semiconductor wafer 802 has at least two adjacent chips 802a. Also as shown in FIG. 2B, the semiconductor wafer 802 further includes a carrier layer 802b, and each chips 802a has an upper surface US and a lower surface DS. Each chip 802a has a device 802a1 and an extending-line 804a. The device 802a1 and the extending-line 804a are disposed on the upper surface US of the chip 102a, and are covered by the carrier layer 802b. The extending-line 804a could be electrically connected to the device 802a1, or an independent circuit without being electrically connected to the device 802a1. As shown in FIG. 10, the extending-line 804a is disposed between the chips 802a. In other words, the extending-line 804a is disposed around the scriber line SL. In addition, a carrier substrate 812 is optional to be attached on the carrier layer 802b. The carrier substrate 812 could fix and support the chips 802a on the semiconductor wafer 802 in following processes. The carrier substrate 812 could be a glass substrate. However, the present disclosure is not limited thereto. It should be noticed that the extending-line 804a corresponding to the chip 802a is disposed in the extending-line protection area 804', and the extending-line 104a does not exceed the boundary (scriber line SL) between the chips 802a. The extending-line protection area 804' has a width w3. The width w3 could be optimized according to actual requirement of space for integrated circuit in the semiconductor wafer 802. Next, a backside of the semiconductor wafer 802 is litho-etched to form three recesses 808 between the chips 802a. As illustrated in FIG. 10, a distance w4 between any two recesses 808 is substantially greater than w3. The distance w4 is coped with w3, and is precisely controlled by litho-etching processes. Besides, the extending-line protection areas 804' illustrated in FIG. 10 are symmetry to the scriber line SL. However, the present disclosure is not limited to it. The extending-line protection areas 804' could also be asymmetry to the scriber line SL.

Figure 11:
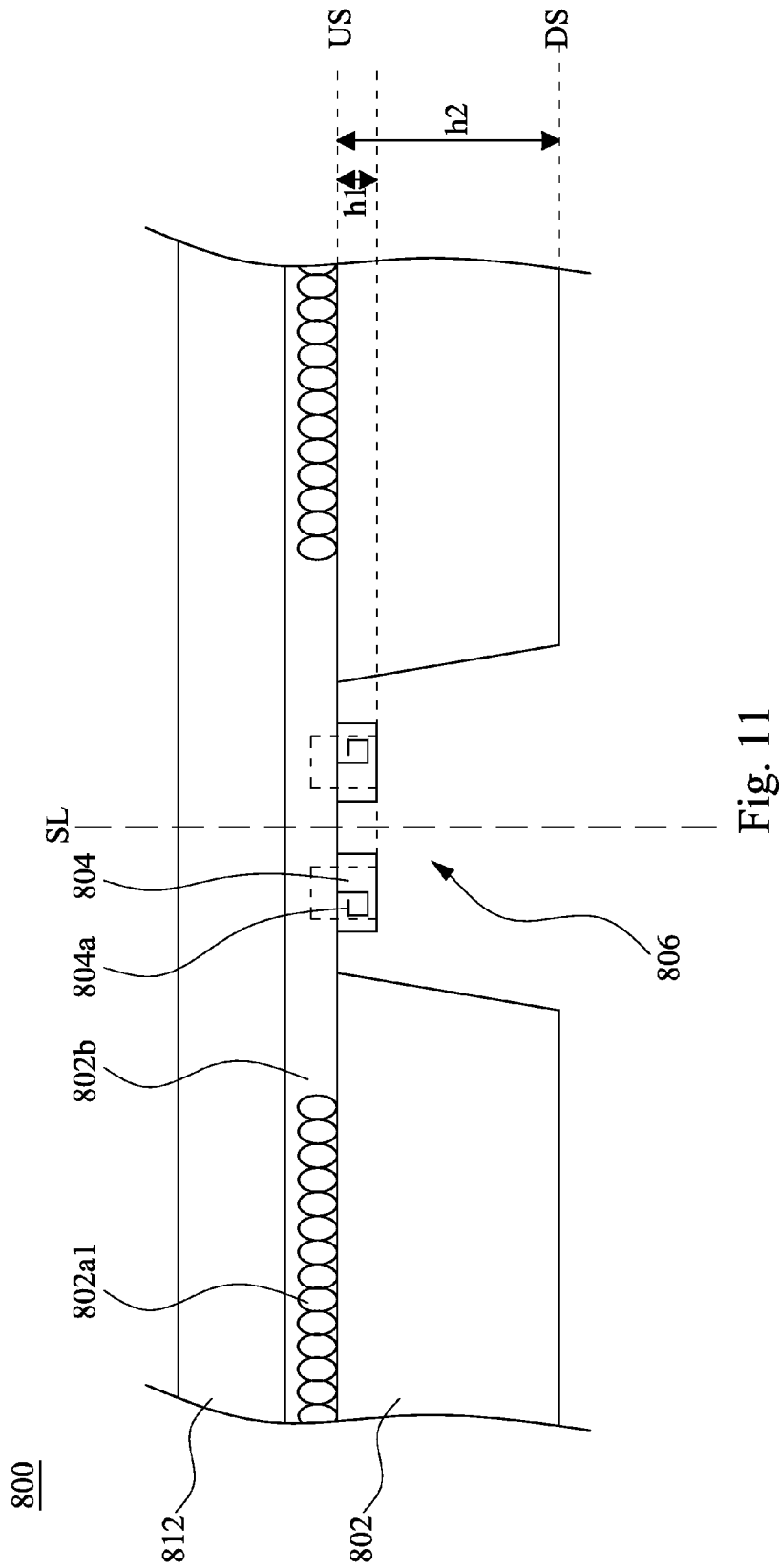

Referring to FIG. 11, the backside of the semiconductor wafer 802 is overall etched to expand the three recesses 808 such that the recesses 108 merging as an inter-chip trench 806, and exposing the extending-line protection area to form two extending-line protections 804a. It should be noticed that the extending-line 804a is still covered in the extending-line protection 804 without being exposed. A thickness of the chip 802a after the operation of overall etching the backside of the semiconductor wafer 802 is h2, and a thickness of the extending-line protection 804 after the operation of overall etching the backside of the semiconductor wafer 102 is h1. In order to smoothly separate the chips 102a in following cutting process, a ratio of the thickness h1 of the extending-line protection 804 and the thickness h2 of the chip 802a is substantially 0.05-0.1. The ratio could be well controlled by selecting proper parameters of the operation of overall etching the backside of the semiconductor wafer 802. The parameters, for example, could include etchants selection, etching time or other possible variables. It should be noticed that the operation of litho-etching the backside of the semiconductor wafer to form at least two recesses is coped with the operation of overall etching the backside of the semiconductor wafer to expand the recesses so as to form a special topography (h2 greater than h1) of the inter-chip trench 806 according to the second embodiment of the present disclosure. In general, forming such a special topography requires two operations of litho-etching. According to the method of the present disclosure, a loading effect, which is a process variation frequently occurred in etching process, is utilized to form the special topography of the inter-chip trench 806 of the second embodiment of the present disclosure. When the loading effect occurs, an etching rate of a portion having larger exposed area is slower than that of a portion having smaller exposed area. As illustrated in FIG. 10, three recesses 808 are formed between two adjacent chips 802a in the operation of litho-etching the backside of the semiconductor wafer 802 such that the exposed area of the semiconductor wafer 802 between any two of the three recesses 808 is larger than that of the other part of semiconductor wafer 802. Therefore, in the following operation of overall etching the backside of the semiconductor wafer 802, an etching rate of the exposed area of the semiconductor wafer 802 between any two of the three recesses 808 is larger than that of the exposed area of the other part of semiconductor wafer 802. Accordingly, the special topography (h2 greater than h1) of the inter-chip trench 806 according to the second embodiment of the present disclosure is formed without extra litho-etching process. Given above, the method of the second embodiment of the present disclosure has simpler sequences, and does not require an extra photomask. Therefore, the cost could be significantly reduced.

Figure 12:
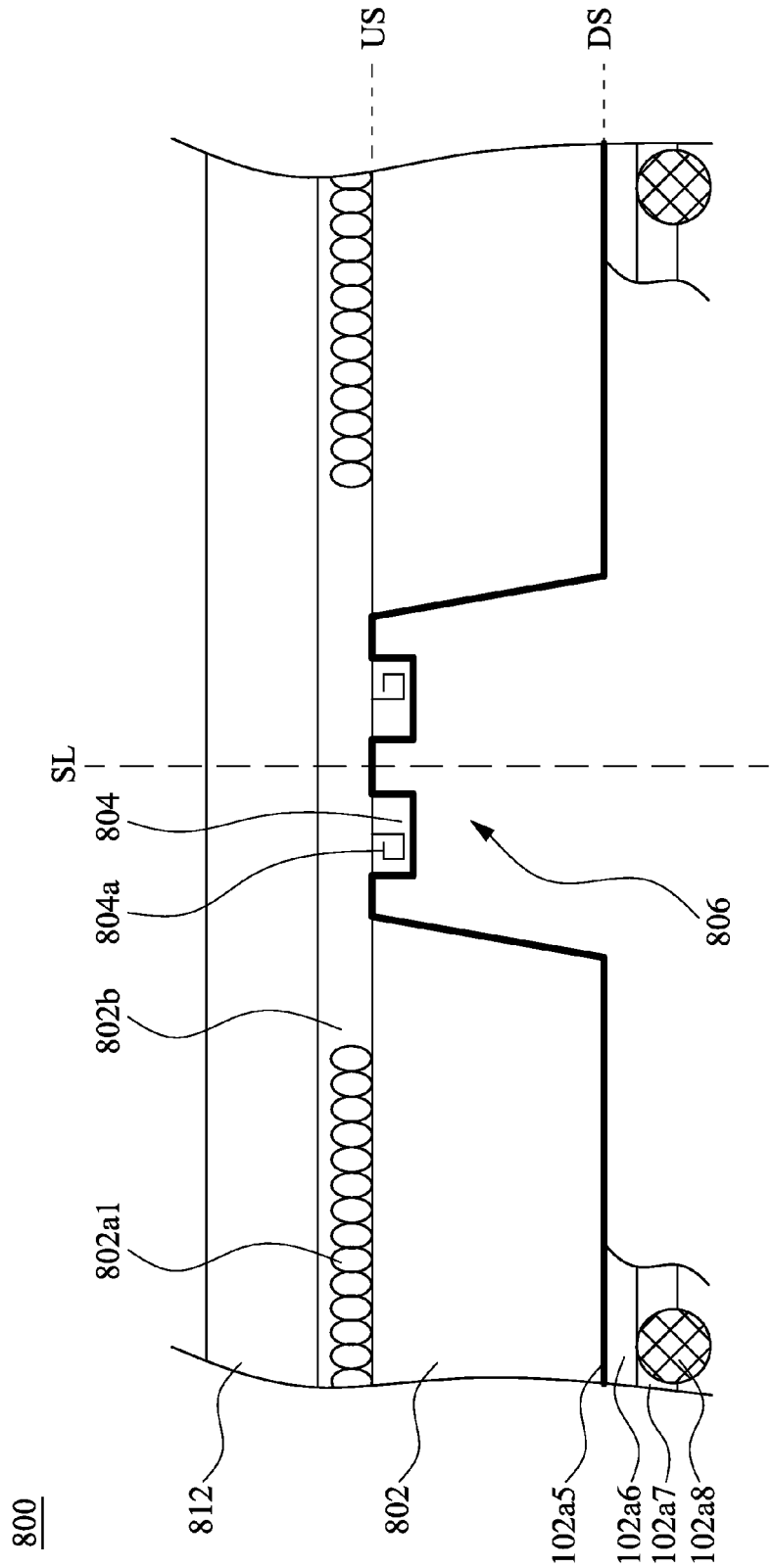

In addition, after the operation of overall etching the backside of the semiconductor wafer 802, the method further includes sequentially forming an isolation layer 102a5, a conducting layer 102a6, a packaging layer 102a7, and at least one solder ball 102a8 on the backside of the semiconductor wafer to form chip packages. As illustrated in FIG. 12, chip packages of two chips are respectively formed on the semiconductor wafer 802. As to positions and relations between the isolation layer 102a5, the conducting layer 102a6, the packaging layer 102a7, and the solder ball 102a8 are described above, and therefore the details are omitted here. Next, cutting along the scriber line SL between the chips 802a from the backside of the semiconductor wafer 802 to separate the chip packages. It should be noticed that the scriber line SL is not overlapped with any one of the extending-line protection 804, and therefore the extending-line 804a would not be damaged during the cutting process. In other words, the separated chip packages respectively has the extending-lines 104a, which is still covered and protected by the extending-line protection 104.

In summary, A wafer level array of chips, a chip package, and a method of wafer level chip package provided in the present disclosure have special topography formed between the chips such that a circuit in the chip could be disposed at an edge of the chip, an inter-chip trench, without affecting following cutting process. Therefore, available space for integrated circuits within a chip could be further increased. Accordingly, issues such as signal interference or shortage caused by excessive density of the integrated circuits could be significantly improved. In addition, the special topography of the inter-chip trench according to various embodiments of the present disclosure is formed without extra litho-etching process. Therefore, the cost could be significantly reduced.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of wafer level chip package, comprising:
providing a semiconductor wafer having at least two adjacent chips and a carrier layer covering the chips, each chip having at least one device and at least one extending-line disposed in at least one extending-line protection area in the semiconductor wafer, wherein the extending-line is electrically conductive;
litho-etching a backside of the semiconductor wafer to form at least two recesses between the chips; and
overall etching the backside of the semiconductor wafer to expand the recesses such that the recesses merging as an inter-chip trench, and exposing the extending-line protection area to form at least one extending-line protection.

2. The method of claim 1, after the operation of overall etching the backside of the semiconductor wafer, further comprising:
sequentially forming an isolation layer, a conducting layer, a packaging layer, and at least one solder ball on the backside of the semiconductor wafer to form chip packages; and
cutting along a scriber line between the chips from the backside of the semiconductor wafer to separate the chip packages,
wherein the scriber line is not overlapped with the extending-line.

3. The method of claim 2, wherein the operation of litho-etching the backside of the semiconductor wafer forms two recesses between the two chips, the operation of overall etching the backside of the semiconductor wafer forms an extending-line protection, and the scriber line is overlapped with the extending-line protection.

4. The method of claim 2, wherein the operation of litho-etching the backside of the semiconductor wafer forms three recesses, the operation of overall etching the backside of the semiconductor wafer forms two extending-line protections, and the scriber line is disposed between the two extending-line protections without being overlapped with any one of the extending-line protections.

5. The method of claim 1, a ratio of a thickness of the extending-line protection and that of the chip is substantially 0.05-0.1.

6. The method of claim 1, between the operation of providing the semiconductor wafer and the operation of litho-etching the backside of the semiconductor wafer, further comprising:
attaching a carrier substrate on the carrier layer.

7. The method of claim 6, wherein the carrier substrate is a glass substrate.

8. The method of claim 1, wherein the device comprises an integrated circuit device, a photovoltaic device, a micro-electromechanical device or a surface acoustic wave (SAW) device.

9. The method of claim 1, wherein the carrier layer comprises silicon oxide, silicon nitride, or silicon oxynitride.

10. A wafer level array of chips, comprising:
   a semiconductor wafer having at least two adjacent chips and a carrier layer, each chip having an upper surface and a lower surface, the chip having at least one device on the upper surface, and the carrier layer covering the upper surface of each chip; and
   at least one extending-line protection disposed below the carrier layer and between the chips, and a thickness of the extending-line protection is less than that of the chip, wherein the extending-line protection has at least one extending-line, wherein the extending line is electrically conductive.

11. The wafer level array of chips of claim 10, wherein a portion of the extending-line is electrically connected to the device through the carrier layer.

12. The wafer level array of chips of claim 10, wherein the extending-line is an independent circuit without being electrically connected to the device.

13. The wafer level array of chips of claim 10, further comprising:
   at least one scriber line positioned between the chips, wherein the scriber line is not overlapped with the extending-line.

14. The wafer level array of chips of claim 10, wherein each chip further comprises:
   a connecting pad structure electrically connected to the device;
   a plurality of vias extending from the lower surface to the upper surface, the vias contacting to the connecting pad structure and exposing a part of the connecting pad structure;
   an isolation layer extending from the lower surface to the upper surface, a part of the isolation layer disposed in the vias;
   a conducting layer disposed below the isolation layer and extending from the lower surface to the upper surface, a part of the conducting layer disposed in the vias, wherein the part of the conducting layer is electrically connected to the device through the connecting pad structure; and
   a packaging layer disposed below the conducting layer.

15. The wafer level array of chips of claim 10, wherein a ratio of a thickness of the extending-line protection and that of the chip is substantially 0.05-0.1.

16. The wafer level array of chips of claim 10, wherein the device comprises an integrated circuit device, a photovoltaic device, a micro-electromechanical device or a surface acoustic wave (SAW) device.

17. The wafer level array of chips of claim 10, wherein the carrier layer comprises silicon oxide, silicon nitride, or silicon oxynitride.

18. A chip package, comprising:
   a carrier layer having an active area and a periphery area surrounding the active area;
   a semiconductor chip disposed in the active area and below the carrier layer, the semiconductor having an upper surface and a lower surface, the semiconductor having at least one device dispose on the upper surface and covered by the carrier layer, and at least one connecting pad structure electrically connected to the device;
   a plurality of vias, the vias extending from the lower surface to the upper surface, the vias contacting the connecting pad structure and exposing a part of the connecting pad structure;
   an isolation layer extending from the lower surface to the upper surface, and a part of the isolation layer disposed in the vias;
   a conducting layer disposed below the isolation layer and extending from the lower surface to the upper surface, a part of the conducting layer disposed in the vias, wherein the part of the conducting layer is electrically connected to the device through the connecting pad structure;
   a packaging layer disposed below the conducting layer;
   at least one extending-line protection corresponding to the periphery area and disposed below the carrier layer; and
   at least one extending-line disposed in the extending-line protection, wherein the extending-line is electrically conductive.

19. The chip package of claim 18, wherein a part of the extending-line is electrically connected to the device through the carrier layer.

20. The chip package of claim 18, wherein the extending-line is an independent circuit without being electrically connected to the device.

21. The chip package of claim 18, wherein a ratio of a thickness of the extending-line protection and that of the chip is substantially 0.05-0.1.

22. The chip package of claim 18, wherein the device comprises an integrated circuit device, a photovoltaic device, a micro-electromechanical device or a surface acoustic wave (SAW) device.

23. The chip package of claim 18, wherein the carrier layer comprises silicon oxide, silicon nitride, or silicon oxynitride.

* * * * *